United States Patent
Richardson et al.

(10) Patent No.: US 12,191,884 B2
(45) Date of Patent: Jan. 7, 2025

(54) EXTENDING LOW-DENSITY PARITY CHECK (LDPC) CODES FOR WI-FI

(71) Applicant: QUALCOMM Incorporated, San Diego, CA (US)

(72) Inventors: Thomas Joseph Richardson, South Orange, NJ (US); Kanke Wu, San Diego, CA (US); Bin Tian, San Diego, CA (US); Didier Johannes Richard Van Nee, Tull en 't Waal (NL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/189,865

(22) Filed: Mar. 24, 2023

(65) Prior Publication Data
US 2024/0322840 A1 Sep. 26, 2024

(51) Int. Cl.
*H03M 13/11* (2006.01)
*H03M 13/00* (2006.01)
*H04L 1/00* (2006.01)

(52) U.S. Cl.
CPC ...... *H03M 13/1174* (2013.01); *H03M 13/116* (2013.01); *H03M 13/616* (2013.01); *H04L 1/0057* (2013.01)

(58) Field of Classification Search
CPC ........... H03M 13/1174; H03M 13/116; H03M 13/616; H04L 1/0057
See application file for complete search history.

(56) References Cited

U.S. PATENT DOCUMENTS

| | | | |
|---|---|---|---|
| 2017/0359148 A1* | 12/2017 | Richardson | H04L 1/0068 |
| 2018/0019840 A1* | 1/2018 | Lomayev | H04L 1/0057 |
| 2019/0288708 A1* | 9/2019 | Ma | H03M 13/118 |
| 2019/0356333 A1* | 11/2019 | Ma | H04L 1/0013 |
| 2024/0063941 A1* | 2/2024 | Kim | H03M 13/1102 |

OTHER PUBLICATIONS

Richardson T., et al., "Design of Low-Density Parity Check Codes for 5G New Radio", IEEE Communications Magazine, Key Technologies for 5G New Radio, vol. 56, No. 3, Mar. 1, 2018, XP055480192, pp. 28-34.
International Search Report and Written Opinion—PCT/US2024/013368—ISA/EPO—May 13, 2024.

(Continued)

*Primary Examiner* — Samir W Rizk
(74) *Attorney, Agent, or Firm* — Arun Swain

(57) ABSTRACT

This disclosure provides methods, components, devices and systems for low-density parity check (LDPC) coding. Some aspects more specifically relate to extending LDPC codewords to produce longer codewords. In some examples, a first wireless device may generate a baseline LDPC code by performing a first lifting on a base matrix, which may produce an LDPC code used for a current Wi-Fi implementation. The first wireless device may then perform a second lifting or a re-lifting (such as a cyclic lifting, a product lifting, a swapping lifting, or a combination thereof) to generate an extended lifted code. This extended lifted code may be an extension of the first LDPC code such that the first LDPC code may be preserved as part of the extended code. Then first wireless device may then transmit the extended LDPC code as an extended or lifted codeword.

30 Claims, 13 Drawing Sheets

(56) References Cited

OTHER PUBLICATIONS

Mahdi et al., A Low Complexity-High Throughput QC-LDPC Encoder, IEEE Transactions on Signal Processing, USA, vol. 62, No. 10, May 15, 2014 (May 15, 2014), pp. 2696-2708, XP011546461, ISSN: 1053-587X, DOI: 10.1109/TSP.2014.2314435 [retrieved on Apr. 25, 2014].

Mitchell et al., Constructing Good QC-LDPC Codes by Pre-lifting Protographs, IEEE Information Theory Workshop, ITW 2012, Sep. 3, 2012 (Sep. 3, 2012), pp. 202-206, XP032300555, DOI: 10.1109/ITW.2012.6404658, ISBN: 978-1-4673-0224-1.

\* cited by examiner 800-a $$S = \begin{bmatrix} 0 & 0 & 0 & 0 & 0 & 0 & 1 \\ 1 & 0 & 0 & 0 & 0 & 0 & 0 \\ 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \end{bmatrix} \xrightarrow{\text{Cyclic Shift } 804} S^3 = \begin{bmatrix} 0 & 0 & 0 & 0 & 1 & 0 & 0 \\ 0 & 0 & 0 & 0 & 0 & 1 & 0 \\ 0 & 0 & 0 & 0 & 0 & 0 & 1 \\ 1 & 0 & 0 & 0 & 0 & 0 & 0 \\ 0 & 1 & 0 & 0 & 0 & 0 & 0 \\ 0 & 0 & 1 & 0 & 0 & 0 & 0 \\ 0 & 0 & 0 & 1 & 0 & 0 & 0 \end{bmatrix}$$

$\underbrace{\phantom{xxxxxxx}}_{802\text{-}a}$ $\underbrace{\phantom{xxxxxxx}}_{802\text{-}b}$ 800-b $$\begin{bmatrix} 0 & 0 & S^{\alpha+1} & 0 \\ 0 & 0 & 0 & S^{\alpha+1} \\ S^{\alpha} & 0 & 0 & 0 \\ 0 & S^{\alpha} & 0 & 0 \end{bmatrix}$$

Inner Cyclic Extension
806

800-c $$\begin{bmatrix} 0 & 0 & S^{\alpha} & 0 \\ 0 & 0 & 0 & S^{\alpha} \\ S^{\alpha} & 0 & 0 & 0 \\ 0 & S^{\alpha} & 0 & 0 \end{bmatrix}$$

Inner Product Extension
808

$$\begin{bmatrix} 0 & S^{\alpha} & 0 \\ S^{\alpha} & 0 & 0 & 0 \\ 0 & 0 & 0 & S^{\alpha} \\ 0 & 0 & S^{\alpha} & 0 \end{bmatrix}$$

Swapping Permutation
810

*Figure 8*

EXTENDING LOW-DENSITY PARITY CHECK (LDPC) CODES FOR WI-FI

TECHNICAL FIELD

This disclosure relates generally to wireless communication, and more specifically, to extending low-density parity check (LDPC) codes for Wi-Fi.

DESCRIPTION OF THE RELATED TECHNOLOGY

A wireless local area network (WLAN) may be formed by one or more wireless access points (APs) that provide a shared wireless communication medium for use by multiple client devices also referred to as wireless stations (STAs). The basic building block of a WLAN conforming to the Institute of Electrical and Electronics Engineers (IEEE) 802.11 family of standards is a Basic Service Set (BSS), which is managed by an AP. Each BSS is identified by a Basic Service Set Identifier (BSSID) that is advertised by the AP. An AP periodically broadcasts beacon frames to enable any STAs within wireless range of the AP to establish or maintain a communication link with the WLAN.

SUMMARY

The systems, methods and devices of this disclosure each have several innovative aspects, no single one of which is solely responsible for the desirable attributes disclosed herein. Techniques described herein may support efficient extensions for low-density parity check (LDPC) coding, and more specifically to techniques for extending an existing LDPC code to a longer code while the original code remains recoverable from the longer code. For example, a first wireless device may perform a first lifting to generate a first LDPC matrix and a first LDPC code by performing a first lifting on a base matrix, which may produce an original code. The first wireless device may then generate an extended LDPC matrix and an extended LDPC code by performing a second lifting on the first LDPC matrix. The first wireless device may then encode a first plurality of bits according to the extended LDPC matrix and the extended LDPC code to produce a lifted codeword, and may transmit the lifted codeword to a second wireless device.

One innovative aspect of the subject matter described in this disclosure can be implemented in a first wireless communication device. The first wireless communication device includes an apparatus which may include a processor, memory coupled with the processor, and instructions stored in the memory. The instructions may be executable by the processor to cause the apparatus to generate a first low-density parity check matrix and a first low-density parity check code by performing a first lifting on a base matrix, generate an extended low-density parity check matrix and an extended low-density parity check code by performing a second lifting on the first low-density parity check matrix, one or more lifted permutation matrices being associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, encode a first set of multiple bits according to the extended low-density parity check matrix and the extended low-density parity check code to produce a lifted codeword, and perform, at a first wireless device, a transmission of the lifted codeword to a second wireless device.

Another innovative aspect of the subject matter described in this disclosure can be implemented in a method for wireless communication. The method includes generating a first low-density parity check matrix and a first low-density parity check code by performing a first lifting on a base matrix, generating an extended low-density parity check matrix and an extended low-density parity check code by performing a second lifting on the first low-density parity check matrix, one or more lifted permutation matrices being associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, encoding a first set of multiple bits according to the extended low-density parity check matrix and the extended low-density parity check code to produce a lifted codeword, and performing, at a first wireless device, a transmission of the lifted codeword to a second wireless device.

Another innovative aspect of the subject matter described in this disclosure can be implemented in a first wireless communication device. The first wireless communication device may include an apparatus may include means for generating a first low-density parity check matrix and a first low-density parity check code by performing a first lifting on a base matrix, means for generating an extended low-density parity check matrix and an extended low-density parity check code by performing a second lifting on the first low-density parity check matrix, one or more lifted permutation matrices being associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, means for encoding a first set of multiple bits according to the extended low-density parity check matrix and the extended low-density parity check code to produce a lifted codeword, and means for performing, at a first wireless device, a transmission of the lifted codeword to a second wireless device.

Another innovative aspect of the subject matter described in this disclosure can be implemented in a non-transitory computer-readable medium storing code for wireless communication. The code may include instructions executable by a processor to generate a first low-density parity check matrix and a first low-density parity check code by performing a first lifting on a base matrix, generate an extended low-density parity check matrix and an extended low-density parity check code by performing a second lifting on the first low-density parity check matrix, one or more lifted permutation matrices being associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, encode a first set of multiple bits according to the extended low-density parity check matrix and the extended low-density parity check code to produce a lifted codeword, and perform, at a first wireless device, a transmission of the lifted codeword to a second wireless device.

In some examples, the extended low-density parity check matrix includes a two-step lifting that includes a first lifting step and a second lifting step and the methods and wireless communication devices may generate an integer pair to identify one or more images of first low-density parity check lifted bit vectors within respective extended lifted parity check bit vectors, a first integer of the integer pair corresponding to the first lifting step and a second integer of the integer pair corresponding to the second lifting step, and bits of a first low-density parity check lifted bit vector of an extended first low-density parity check lifted bit vector may be enumerated first according to the first integer of the integer pair identifying a bit within the first low-density parity check lifted bit vector and second according to the second integer of the integer pair identifying an image of the first low-density parity check lifted bit vector within an extended low-density parity check lifted parity check bit vector and perform the first lifting step and the second lifting step in accordance with an inner extension or an outer extension of the first lifting to produce the extended low-density parity check code.

In some examples, of the methods and wireless communication devices, the second lifting step includes the inner extension that retains first low-density parity check liftings as a sub-component of extended low-density parity check liftings in accordance with the first lifting being recoverable from the second lifting via an application of a bit mask or an application of a modulo operation.

In some examples of the methods and wireless communication devices, the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

In some examples, the methods and wireless communication devices may swap at least two images of the one or more images of the first low-density parity check code during the first lifting step or the second lifting step.

In some examples of the methods and wireless communication devices, the extended low-density parity check code includes one or more lifted low-density parity check codes including at least the first low-density parity check code that may be recoverable from the extended low-density parity check code.

Another innovative aspect of the subject matter described in this disclosure can be implemented in a first wireless communication device. The first wireless communication device includes an apparatus which may include a processor, memory coupled with the processor, and instructions stored in the memory. The instructions may be executable by the processor to cause the apparatus to generate a first low-density parity check matrix and a first low-density parity check code by performing a first lifting on a base matrix, generate an extended low-density parity check matrix and an extended low-density parity check code by performing a second lifting on the first low-density parity check matrix, one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, receive, from a first wireless device, a lifted codeword encoded in accordance with the extended low-density parity check matrix, and decode the lifted codeword according to the extended low-density parity check code.

Another innovative aspect of the subject matter described in this disclosure can be implemented in a method for wireless communication. The method includes generating a first low-density parity check matrix and a first low-density parity check code by performing a first lifting on a base matrix, generating an extended low-density parity check matrix and an extended low-density parity check code by performing a second lifting on the first low-density parity check matrix, one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, receiving, from a first wireless device, a lifted codeword encoded in accordance with the extended low-density parity check matrix, and decoding the lifted codeword according to the extended low-density parity check code.

Another innovative aspect of the subject matter described in this disclosure can be implemented in a first wireless communication device. The first wireless communication device may include an apparatus may include means for generating a first low-density parity check matrix and a first low-density parity check code by performing a first lifting on a base matrix, means for generating an extended low-density parity check matrix and an extended low-density parity check code by performing a second lifting on the first low-density parity check matrix, one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, means for receiving, from a first wireless device, a lifted codeword encoded in accordance with the extended low-density parity check matrix, and means for decoding the lifted codeword according to the extended low-density parity check code.

Another innovative aspect of the subject matter described in this disclosure can be implemented in a non-transitory computer-readable medium storing code for wireless communication. The code may include instructions executable by a processor to generate a first low-density parity check matrix and a first low-density parity check code by performing a first lifting on a base matrix, generate an extended low-density parity check matrix and an extended low-density parity check code by performing a second lifting on the first low-density parity check matrix, one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code, receive, from a first wireless device, a lifted codeword encoded in accordance with the extended low-density parity check matrix, and decode the lifted codeword according to the extended low-density parity check code.

In some examples of the methods and wireless communication devices, the extended low-density parity check matrix includes a two-step lifting that includes a first lifting step and a second lifting step and the methods and wireless communication devices may generate an integer pair to identify one or more images of first low-density parity check lifted bit vectors within respective extended lifted low-density parity check bit vectors, a first integer of the integer pair corresponding to the first lifting step and a second integer of the integer pair corresponding to the second lifting step, and bits of a first low-density parity check lifted bit vector of an extended low-density parity check lifted bit vector may be enumerated first according to the first integer of the integer pair identifying a bit within the first low-density parity check lifted bit vector and second according to the second integer of the integer pair identifying an image of the first low-density parity check lifted bit vector within an extended low-density parity check lifted bit vector and decode the lifted codeword in accordance with the first lifting step and the second lifting step in accordance with an inner extension or an outer extension.

In some examples, the methods and wireless communication devices may decode the lifted codeword in accordance with the inner extension, the inner extension retaining a first low-density parity check lifting permutation identifier as a sub-component of an extended low-density parity check lifting permutation identifier in accordance with the first low-density parity check lifting permutation identifier being recoverable from the extended low-density parity check lifting permutation identifier via an application of a bit mask or a modulo operation.

In some examples of the methods and wireless communication devices, the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

In some examples, the methods and wireless communication devices may swap at least two images of the one or more images of the first low-density parity check code during the first lifting step or the second lifting step.

In some examples of the methods and wireless communication devices, the extended low-density parity check code includes one or more lifted low-density parity check codes including at least the first low-density parity check code that may be recoverable from the extended low-density parity check code.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

FIG. 8 shows block sub-matrix recovery of a first lifting that support extending LDPC codes for Wi-Fi.

Like reference numbers and designations in the various drawings indicate like elements.

DETAILED DESCRIPTION

Figure 1:
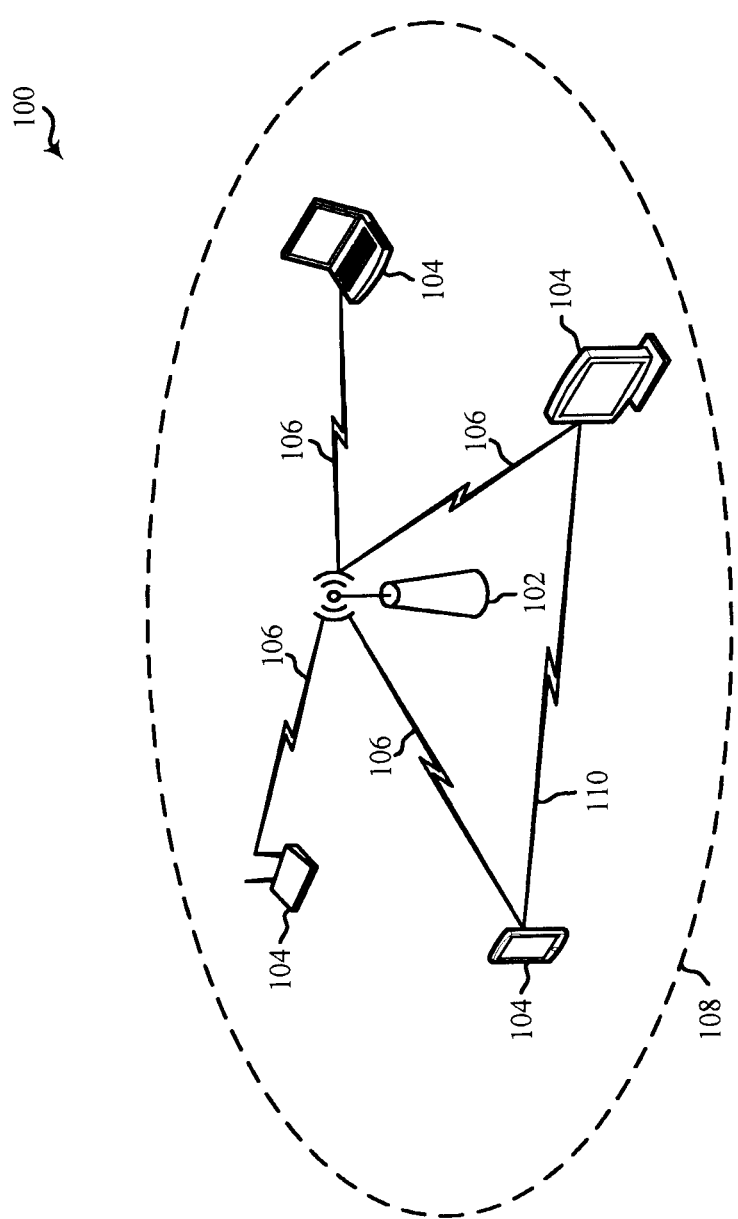
FIGS. 1 and 2 show pictorial diagrams of example wireless communication networks that support extending low-density parity (LDPC) check codes for Wi-Fi.

The following description is directed to some particular examples for the purposes of describing innovative aspects of this disclosure. However, a person having ordinary skill in the art will readily recognize that the teachings herein can be applied in a multitude of different ways. Some or all of the described examples may be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the $3^{rd}$ Generation Partnership Project (3GPP), among others. The described examples can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), spatial division multiple access (SDMA), rate-splitting multiple access (RSMA), multi-user shared access (MUSA), single-user (SU) multiple-input multiple-output (MIMO) and multi-user (MU)-MIMO. The described examples also can be implemented using other wireless communication protocols or RF signals suitable for use in one or more of a wireless personal area network (WPAN), a wireless local area network (WLAN), a wireless wide area network (WWAN), a wireless metropolitan area network (WMAN), or an internet of things (IoT) network.

Various aspects relate generally to wireless communication and more particularly to low-density parity check (LDPC) codes. Some aspects more specifically relate to extending existing LDPC codes. In some examples, LDPC codes may support efficient and relatively low-error transmission of data over wireless communications channels, and may be implemented as forward error correction (FEC) codes in several communications standards such as the wireless local area network (WLAN, IEEE 802.11). LDPC coding, however, may be associated with relatively large codes and varying codeword lengths, including at least 648 bits, 1296 bits, and 1944 bits. These different codeword lengths may further increase as bandwidths increase, higher modulation orders are introduced, and more spatial streams are available. While such increases in LDPC codeword length may increase channel and device performance, device encoders and decoders supporting extended LDPC codes may be subject to various power, area, latency, and cost constraints, which may present challenges for implementing efficient hardware capable of LDPC encoding and decoding for extended LDPC codewords.

Various techniques described herein may support extended LDPC codewords with reduced impact on device hardware using extended liftings of lifted base graphs (such as extended liftings of 802.11 lifted base graphs for Wi-Fi), which preserve the structure of existing LDPC codes within an extended code. To efficiently extend LDPC codes to increase performance without significant burden on device hardware, a wireless device may implement an additional lifting to extend an existing lifting of a base graph, such as for Wi-Fi codewords. For example, the wireless device may perform a first lifting such as a cyclic lifting on a base graph to produce a Wi-Fi code, and apply an additional lifting or a re-lifting (such as an additional cyclic lifting, a product lifting, a swapping lifting, or a combination thereof) to extend the current lifting of the Wi-Fi length-1944 LDPC base graph to create codewords that have lengths that are several multiple times the length of an original code length (for example, 2×, 4×, 8×, 16×, and beyond, the length of the original code). The same methods may be applied to smaller Wi-Fi codewords to obtain a relatively finer set of codeword lengths. The techniques described herein may preserve existing LDPC structures to have minimal impact on device hardware by producing extended LDPC codes that are made up by combining operations of smaller existing LDPC codes. The preservation of existing structures admits fallback operation to multiple instances of existing LDPC codes, in addition to or as an alternative to the combined operation that implements the extended LDPC codes.

Particular aspects of the subject matter described in this disclosure can be implemented to realize one or more of the following potential advantages. As wireless communication technology has progressed, and throughput has correspondingly increased, it has become common for wireless devices to contain multiple instances of LDPC encoders and decoders. Extending the LDPC codes to admit implementation that combines possibly pre-existing multiple decoders or encoders into larger single decoders or single encoders capable of decoding or encoding the extended codewords may then increase performance gains associated with larger block sizes without substantially increasing the hardware burden of the device. If the combining also preserves the original structure of the smaller encoding and decoding blocks so that the original operations used for encoding and decoding the smaller LDPC codes are retained as subcomponents of the larger decoding and encoding systems, then the additional cost for the larger blocks may be reduced. Additionally or alternatively, the smaller combined encoding and decoding blocks may also be used in their original form as encoding and decoding blocks of the smaller LDPC codes. Legacy devices may not support the larger block sizes, so communications may revert the combined smaller blocks to their independent status as separate blocks for smaller codewords. A further advantage to preserving the original LDPC code structures as substructures of the larger code is that from a data-handling standpoint, transmission of the larger blocks would closely resemble transmission of the multiple smaller blocks. In such examples, nearly seamless integration of the larger codewords into existing systems may be achieved. In some examples, by preserving the original structure of an existing LDPC code, the described techniques can be used to reduce decoding and encoding complexity for LDPC codes. The techniques described may further support reduced hardware costs based on re-use of existing hardware to support extended LDPC codes.

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of wireless communication protocol standards (such as that defined by the IEEE 802.11-2020 specification or amendments thereof including, but not limited to, 802.11ay. 802.11ax, 802.11az, 802.11ba, 802.11bd, 802.11be, 802.11bf, and the 802.11 amendment associated with Wi-Fi 8). The WLAN 100 may include numerous wireless communication devices such as a wireless AP 102 and multiple wireless STAs 104. While only one AP 102 is shown in FIG. 1, the WLAN network 100 also can include multiple APs 102. AP 102 shown in FIG. 1 can represent various different types of APs including but not limited to enterprise-level APs, single-frequency APs, dual-band APs, standalone APs, software-enabled APs (soft APs), and multi-link APs. The coverage area and capacity of a cellular network (such as LTE, 5G NR, etc.) can be further improved by a small cell which is supported by an AP serving as a miniature base station. Furthermore, private cellular networks also can be set up through a wireless area network using small cells.

Each of the STAs 104 also may be referred to as a mobile station (MS), a mobile device, a mobile handset, a wireless handset, an access terminal (AT), a user equipment (UE), a subscriber station (SS), or a subscriber unit, among other examples. The STAs 104 may represent various devices such as mobile phones, personal digital assistant (PDAs), other handheld devices, netbooks, notebook computers, tablet computers, laptops, chromebooks, extended reality (XR) headsets, wearable devices, display devices (for example, TVs (including smart TVs), computer monitors, navigation systems, among others), music or other audio or stereo devices, remote control devices ("remotes"), printers, kitchen appliances (including smart refrigerators) or other household appliances, key fobs (for example, for passive keyless entry and start (PKES) systems), Internet of Things (IoT) devices, and vehicles, among other examples. The various STAs 104 in the network are able to communicate with one another via the AP 102.

A single AP 102 and an associated set of STAs 104 may be referred to as a basic service set (BSS), which is managed by the respective AP 102. FIG. 1 additionally shows an example coverage area 108 of the AP 102, which may represent a basic service area (BSA) of the WLAN 100. The BSS may be identified or indicated to users by a service set identifier (SSID), as well as to other devices by a basic service set identifier (BSSID), which may be a medium access control (MAC) address of the AP 102. The AP 102 may periodically broadcast beacon frames ("beacons") including the BSSID to enable any STAs 104 within wireless range of the AP 102 to "associate" or re-associate with the AP 102 to establish a respective communication link 106 (hereinafter also referred to as a "Wi-Fi link"), or to maintain a communication link 106, with the AP 102. For example, the beacons can include an identification or indication of a primary channel used by the respective AP 102 as well as a timing synchronization function for establishing or maintaining timing synchronization with the AP 102. The AP 102 may provide access to external networks to various STAs 104 in the WLAN via respective communication links 106.

To establish a communication link 106 with an AP 102, each of the STAs 104 is configured to perform passive or active scanning operations ("scans") on frequency channels in one or more frequency bands (for example, the 2.4 GHZ, 5 GHZ, 6 GHZ or 60 GHz bands). To perform passive scanning, a STA 104 listens for beacons, which are transmitted by respective APs 102 at a periodic time interval referred to as the target beacon transmission time (TBTT) (measured in time units (TUs) where one TU may be equal to 1024 microseconds (µs)). To perform active scanning, a STA 104 generates and sequentially transmits probe requests on each channel to be scanned and listens for probe responses from APs 102. Each STA 104 may identify, determine, ascertain, or select an AP 102 with which to associate in accordance with the scanning information obtained through the passive or active scans, and to perform authentication and association operations to establish a communication link 106 with the selected AP 102. The AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA or to select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

The APs 102 and STAs 104 may function and communicate (via the respective communication links 106) according to one or more of the IEEE 802.11 family of wireless communication protocol standards. These standards define the WLAN radio and baseband protocols for the PHY and MAC layers. The APs 102 and STAs 104 transmit and receive wireless communications (hereinafter also referred to as "Wi-Fi communications" or "wireless packets") to and from one another in the form of PHY protocol data units (PPDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some examples of the APs 102 and STAs 104 described herein also may communicate in other frequency bands, such as the 5.9 GHZ and the 6 GHz bands, which may support both licensed and unlicensed communications. The APs 102 and STAs 104 also can communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11n, 802.11ac, 802.11ax and 802.11be standard amendments may be transmitted over the 2.4, 5 GHZ or 6 GHz bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHZ, 80 MHZ, 160 or 320 MHz by bonding together multiple 20 MHZ channels.

Each PPDU is a composite structure that includes a PHY preamble and a payload in the form of a PHY service data unit (PSDU). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is associated with the particular IEEE 802.11 protocol to be used to transmit the payload.

In some wireless communications environments, Extremely High Throughput (EHT) systems or other systems compliant with future generations of the IEEE 802.11 family of wireless communication protocol standards may provide additional capabilities over other previous systems (for example, High Efficiency (HE) systems or other legacy systems). EHT and newer wireless communication protocols may support flexible operating bandwidth enhancements at APs and STAs, such as broadened operating bandwidths relative to legacy operating bandwidths or more granular operation relative to legacy operation. For example, an EHT system may allow communications spanning operating bandwidths of 20 MHz, 40 MHZ, 80 MHz, 160 MHZ, 240 MHz and 320 MHz. EHT systems may support multiple bandwidth modes such as a contiguous 240 MHz bandwidth mode, a contiguous 320 MHz bandwidth mode, a noncontiguous 160+160 MHz bandwidth mode, or a noncontiguous 80+80+80+80 (or "4×80") MHz bandwidth mode.

The operating bandwidth also may accommodate concurrent operation on other unlicensed frequency bands (such as the 6 GHz band) and a portion of spectrum that includes frequency bands traditionally used by Wi-Fi technology. In noncontiguous examples, the operating bandwidth may span one or more disparate sub-channel sets. For example, the 320 MHz bandwidth may be contiguous and located in the same 6 GHz band or noncontiguous and located in different bands (such as partly in the 5 GHz band and partly in the 6 GHz band).

In some examples, operability enhancements associated with EHT and newer generations of the IEEE 802.11 family of wireless communication protocols, and in particular operation at an increased bandwidth, may include refinements to carrier sensing and signal reporting mechanisms.

Such techniques may include modifications to existing rules, structure, or signaling implemented for legacy systems.

LDPC codes may be used as forward error correcting codes to support accurate data transmission in wireless communications network 100. Some LDPC encoded transmission schemes may be associated with relatively large and varying codeword length, including at least 648 bits, 1296 bits, and 1944 bits, which may further increase as bandwidths increase, higher modulation orders are introduced, and more spatial streams are available. Various techniques described herein may support extended LDPC codewords with reduced impact on device hardware and may also enable full utilization backward compatibility with original LDPC codeword sizes using extended liftings of existing base graphs (such as extended liftings of 802.11 base graphs for Wi-Fi), which preserve the structure of existing LDPC codes within an extended code. To efficiently extend LDPC codewords to increase performance without significant burden on device hardware, a wireless device such as the AP 102 may implement an additional lifting to extend an existing lifting of Wi-Fi codewords. For example, the AP 102 may perform a first lifting such as a cyclic lifting on a base graph to produce a Wi-Fi code, and apply an additional lifting or a re-lifting (such as an additional cyclic lifting, a product lifting, a swapping lifting, or a combination thereof) to extend the current lifting of size Z=81 of the Wi-Fi LDPC base graphs, which yields codeword length 81×24=1944, to create codewords that have lengths that are several multiple times the length of an original code length (for example, 2×, 4×, 8×, 16×, and beyond, the length of the original code).

Figure 2:
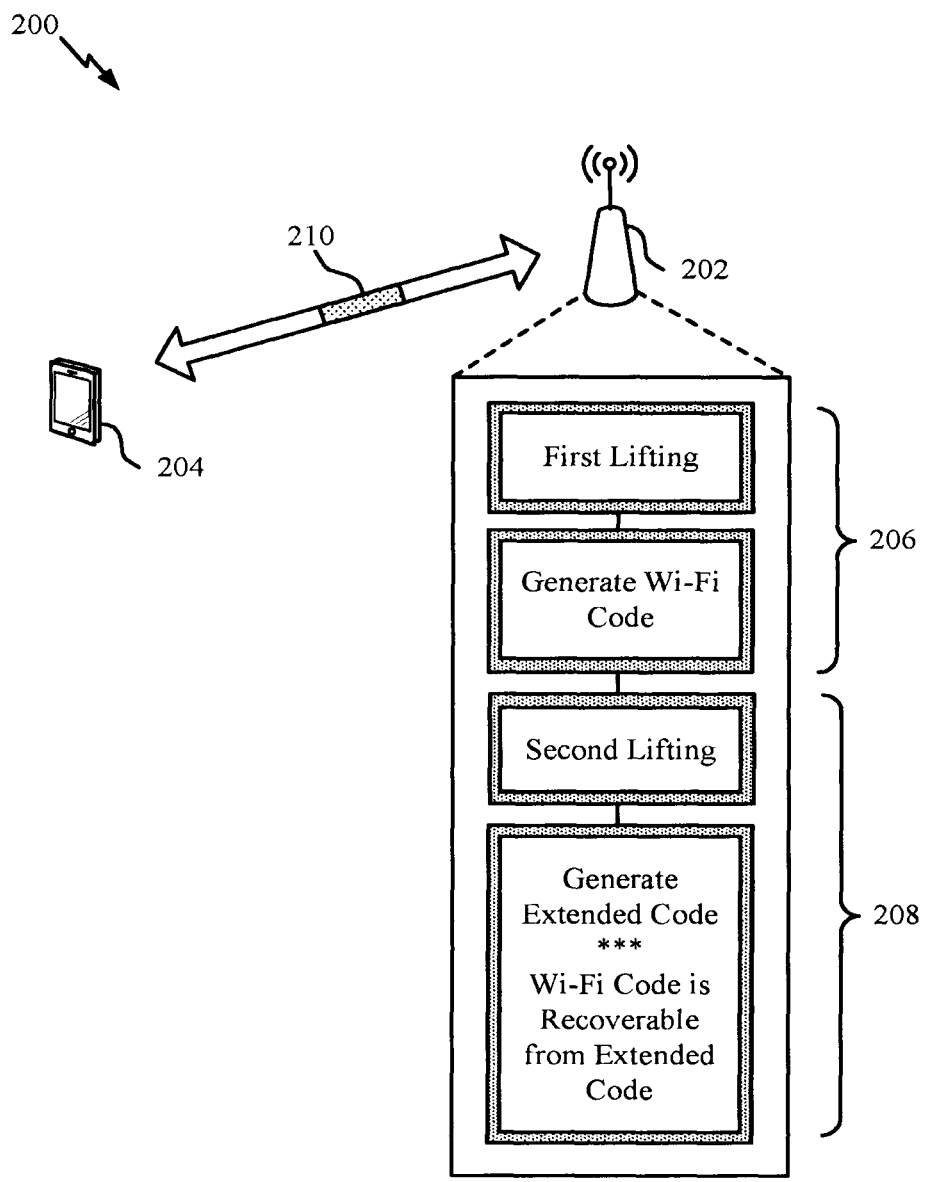

FIG. 2 shows an example of a wireless communication network 200 that supports extending LDPC codes for Wi-Fi. For example, wireless communication network 200 may show communications between an AP 202 and a STA 204.

LDPC codes are linear-error correcting codes that are constructed using a sparse Tanner graph (a subclass of a bipartite graph), and may be used to transmit data over a relatively noisy channel. LDPC codes may be implemented to accurately and efficiently send data over a channel in accordance with code rate being relatively close to a theoretical maximum (for example, the Shannon limit) for the channel, which thereby efficiently reduces the probability of lost information. LDPC codes may be implemented as forward error correction (FEC) codes in several communications standards such as the wireless local area network (WLAN, IEEE 802.11n), wireless radio access network (WRAN, IEEE 802.22), digital video broadcast (DVB), and the Advanced Television System Committee (ATSC). Additionally or alternatively, LDPC coding may be used to support cellular wireless communications (such as fifth generation (5G) communication) for enhanced Mobile Broad Band (eMBB) data channels In some implementations, for example, one OFDM symbol or frame in Wi-Fi may be constructed to contain multiple length-1944 codewords. Combining multiple codewords into a longer extended codeword may increase channel and device performance. In some cases, however, device encoders and decoders supporting extended LDPC codes (such as decoders and encoders present at the AP 202 and the STA 204) may be subject to various power, area, latency, and cost constraints, which may present challenges for implementing efficient hardware capable of LDPC encoding and decoding for extended LDPC codewords.

Various techniques described herein may support extended LDPC codewords with reduced impact on device hardware using extended liftings of existing base graphs (such as extended 802.11 base graphs for Wi-Fi), which preserve the structure of existing LDPC codes within an extended code. In some examples, an LDPC code may be based on or generated by the lifting of a small graph called a base graph or a "protograph," which captures a macroscopic (e.g., node degree) structure of the code such that a larger graph with that structure may be constructed by lifting the base graph. The lifted graph may be obtained by taking Z copies of the base graph and permuting the Z copies of a base edge between the Z copies. For example, some LDPC codewords that are 1944 bits in length may be constructed using a base graph having 24 variable nodes and a Z value of 81. In some examples, this entails 81 copies of a base edge connecting 81 copies of a base variable node to 81 copies of a base check node. The 81 connections corresponding to the edges may be permuted to intertwine the 81 copies forming a larger connected graph. The permutation (for example, the permuting of the Z copies of the base edge between the Z copies of base variable and check nodes) may be of special form as described via different liftings, for example, cyclic lifting, product lifting, swapping lifting, or any combination thereof. The permutations are often, or at least in some implementations, represented as integers indexing a particular permutation. Additionally or alternatively, the extended permutations may be represented using an inner representation or an outer representation of the extension, where an existing permutation index is extended on either the low or higher order digits, and in some examples, binary digits.

To efficiently extend LDPC codewords to increase performance without significant burden on hardware, a device such as the AP 202 or STA 204 may implement an additional lifting to extend an existing lifting of Wi-Fi codewords. For example, the AP 202 may apply an additional lifting to extend the current lifting of the Wi-Fi length-1944 bit LDPC codewords base graph to create codewords that have lengths that are several multiple times the length of an original length 1944 code (for example, 2×, 4×, 8×, 16×, and beyond, the length of the original code).

For example, at 206, the AP 202 may generate a baseline or "original" code by performing a first lifting on a base matrix. This first lifting may produce, for example, an LDPC code used for a current 802.11 Wi-Fi implementation. Then, at 208, the AP 202 may perform a second lifting or a re-lifting (for example, a cyclic lifting, a product lifting, a swapping lifting, or a combination thereof) to generate an extended lifted code. In some implementations, the extended lifted code may be an extension of the existing Wi-Fi code such that the Wi-Fi code generated at 206 may be preserved as part of the extended code. For example, one or more lifted permutation matrices associated with base edges of a first low-density parity check matrix used to perform the first lifting may be recoverable as block-wise sub-matrices of lifted permutation matrices associated with respective base edges of an extended low-density parity check matrix used to generate the extended code. The AP 202 may then transmit the extended LDPC code as an extended or lifted codeword 210.

The techniques described herein may preserve existing code structure to have minimal impact on device hardware by producing extended LDPC codes that are made up of a lifted mixing of smaller existing LDPC code structures. For example, aspects of an original LDPC code known to the STA 204 could be preserved as a sub-element of the new extended LDPC code to reduce encoding and decoding complexity. Implementations supporting the extended LDPC code may in some examples fall back to parallel implementations of the original LDPC code.

Figure 3:
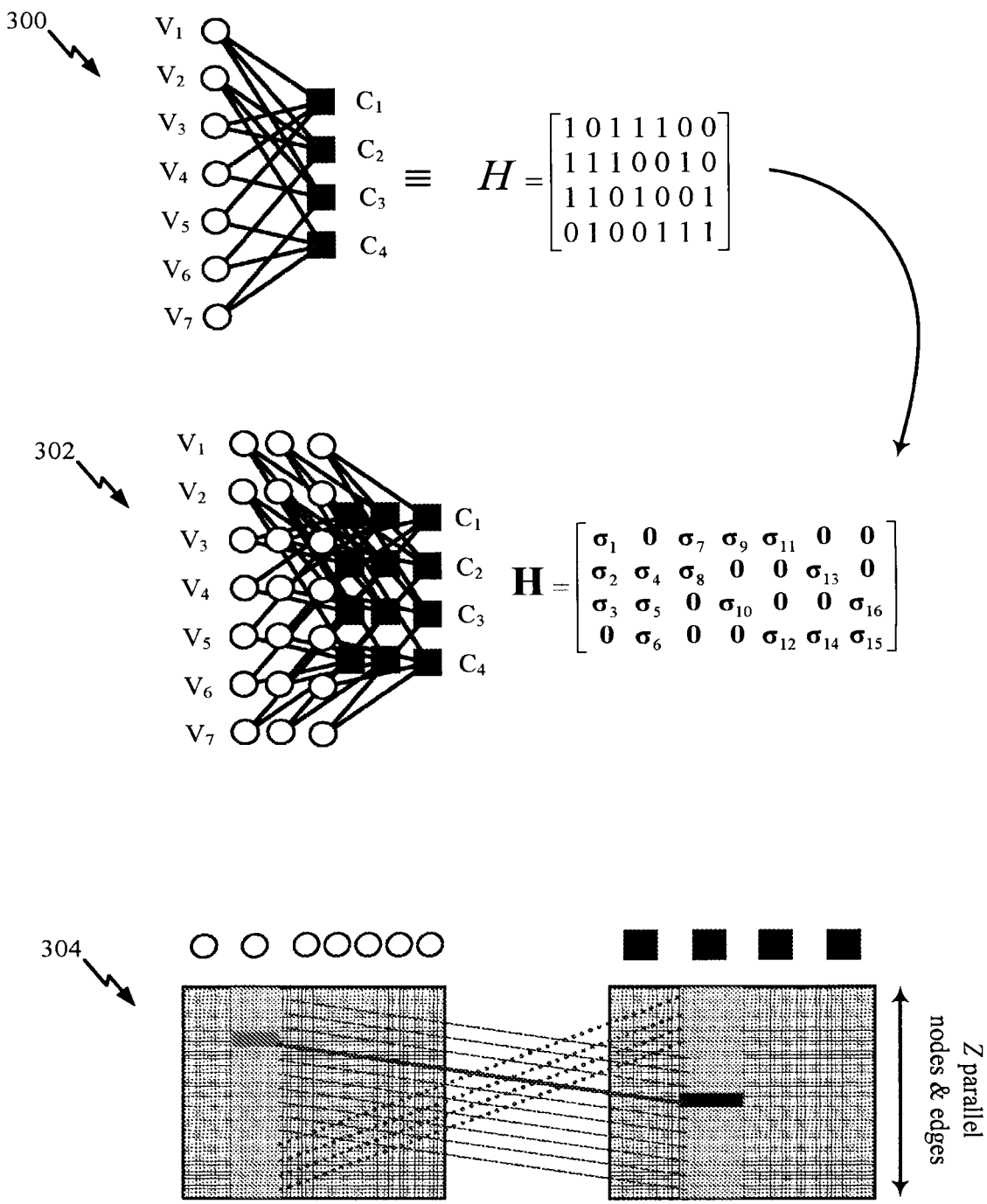
FIG. 3 shows an example of a base graph comprised of a set of variable nodes and check nodes, edges connecting the nodes, and a lifting procedure that introduces multiple copies of the base graph and permutes the lifted edges that supports extending LDPC codes for Wi-Fi.

FIG. 3 shows an example of a base graph comprised of a set of variable nodes and check nodes, the edges connecting the nodes, and a lifting process that introduces multiple copies of the base graph and permutes the lifted base edges. FIG. 3 may support a graphical representation of the lifting process, in which a larger Tanner graph is constructed from a lifting of a base Tanner graph, and an algebraic representation of the parity check matrix in which entries of the base parity check matrix are replaced by square matrices whose size corresponds to the size of the lifting. A lifting as illustrated in the example of FIG. 3 may be performed at or by various devices described herein.

An LDPC code parity check matrix may be represented by a Tanner or bipartite graph which has a correspondence with a parity check representation in which rows of the parity check matrix correspond to check nodes in the Tanner graph and columns of the parity check matrix correspond to variable nodes in the Tanner graph. Check nodes and variable nodes may be connected by an edge if the corresponding row and column have a "1" entry in the matrix, and an absence of an edge is represented by a "0" entry in the matrix.

FIG. 3 shows a Tanner graph 300 for an example base LDPC code. For example, the Tanner graph 300 includes seven variable nodes V1 through V7 represented by seven circles and four check nodes C1 through C4 represented by four squares. Each variable node represents a code bit, which may be either transmitted or punctured (not transmitted). The seven code bits for variable nodes V1 through V7 form a codeword. The variable nodes are connected to the check nodes via edges. The base parity check matrix H corresponding to Tanner graph 300 may include seven columns for the seven variable nodes V1 through V7 and four rows for the four check nodes C1 through C4. Each column of H includes a 1 element for each edge connected to the variable node corresponding to that column. For example, column 1 includes three 1 s in rows 1, 2 and 3 for the three edges a, b and c connecting the corresponding variable node V1 to check nodes C1, C2 and C3 in Tanner graph 300. Each remaining column of H includes two or three 1s for two or three edges connecting the corresponding variable node to two or three check nodes. In some versions (such as some generalized versions) the base Tanner graph may have multiple edges in which a variable node and check node are connected by more than one edge. In such examples, the base parity matrix may not be binary and may have integer entries larger than one to reflect the multiple edges.

A small base LDPC code may be lifted to obtain a larger lifted LDPC code. The lifting may be described from the Tanner graph or from the algebraic perspective. In an algebraic description, the lifting may be achieved by replacing each "1" element in a base parity check matrix for the base LDPC code with a Z×Z permutation matrix while "0" elements may be replaced with Z×Z "0" matrices to obtain a lifted parity check matrix for the lifted LDPC code which may be Z times larger than the base code. From the graphical perspective, Z copies of a base graph for the base LDPC code may be generated. The Z×Z permutation matrices in the lifted parity check matrix correspond to the permutation of the lifted edges connecting variable nodes in each graph copy to the check nodes in the Z graph copies. For example, each non-zero element of H (which corresponds to an edge in the Tanner graph) is replaced with a Z×Z permutation matrix to obtain an extended graph 302 and a lifted parity check matrix H. Specifically, the small graph corresponds with a constructed base H, and, in the lifting, each element of the base parity check matrix H is replaced with a Z×Z matrix (for example, edges ("1's") may be replaced with cyclic permutation matrices ($\sigma$)).

In a compact visual representation 304, entries in a grid may represent edges in the lifted graph in which columns correspond to base edges and the number of rows to the lifting size Z. A base edge is associated to a base variable node on the one hand and a base check node on the other. In the lifted representation, the corresponding columns are connected by a permutation. The Z copies of each edge may be cyclically shifted by an amount determined by the cyclic permutation matrix for that edge. The grid may illustrate Z parallel nodes and edges, and may illustrate efficient parallel encoding as a Z-parallel implementation of the base decoder and encoder.

Given a parity check matrix, permuting the rows arbitrarily may not change the code, whereas permuting the columns is equivalent to permuting the elements (bits) of the codeword. When performing a lifting, the order of the bits in the lifted code may correspond to the base order, where each bit in the base code is replaced with a vector of Z bits, where Z is the lifting size.

In some examples, extended lifting may be performed in accordance with the techniques and structures described herein to preserve existing lifting structure. For example, performing extended liftings on the Tanner graph 300 may produce extended LDPC codes that are made up of smaller existing LDPC structures corresponding to a smaller lifting. For example, one or more lifted permutation matrices associated with a first matrix resulting from a first lifting may be recoverable as block-wise sub-matrices of extended lifted permutation matrices associated with base edges of the base graph associated to both liftings.

Figure 4:
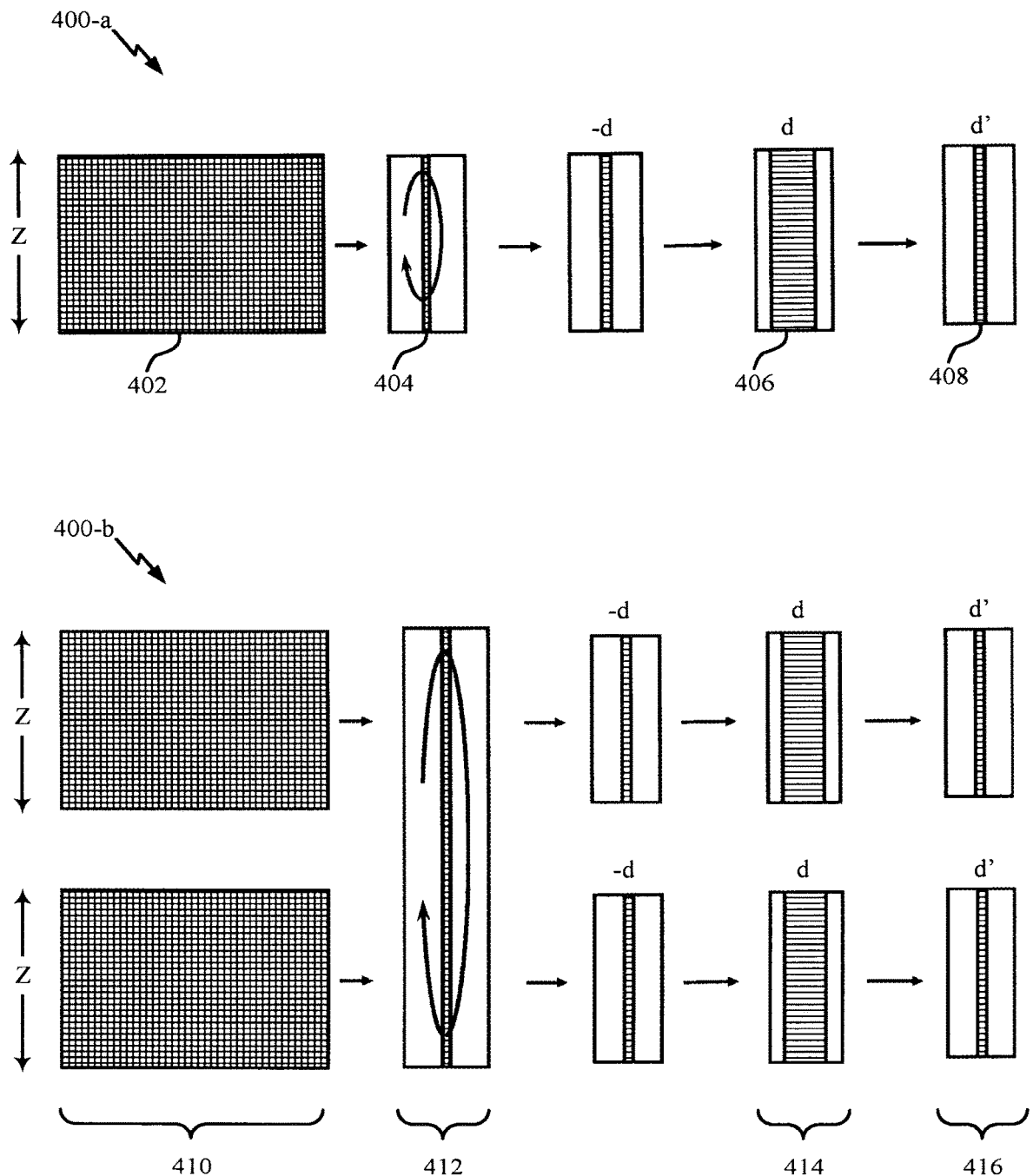
FIG. 4 shows an example of an LDPC decoding process at a layered decoder that supports extending LDPC codes for Wi-Fi.

FIG. 4 shows an example of an LDPC decoding process 400-$a$ and LDPC decoding process 400-$b$ performed via a layered decoding processes that supports extending LDPC codes, e.g., for Wi-Fi. In some examples, the LDPC decoding process 400-$a$ and the LDPC decoding process 400-$b$ may be performed at or by one or more wireless devices described herein.

FIG. 4 may illustrate LDPC decoder flows, including the LDPC decoding process 400-$a$ for a Z×24 grid of memory ($V_{mem}$). The columns represent Z images of a base variable node within which a value is stored as part of a decoding process. In some examples, LDPC codes may be decoded via message-passing algorithms which iteratively exchange the messages through the edges between variable nodes and check nodes. In some examples, such as for decoding of quasi-cyclic LDPC codes (liftings using cyclic permutation), the decoder may read a column 404 from memory 402, and permute the column 404 to align the lifted variable node values with a lifted check node. The decoder may then subtract a previous check node message vector d obtained from the saved compressed check output to obtain an updated message 406, to obtain a vector input for parallel check node processing. The decoder may then perform parallel processing (such as Z parallel check node processing) to obtain the vector message 408 ($d'$) which is outgoing from the parallel check node processors along the lifted edge.

Additionally or alternatively, at LDPC decoding process 400-$b$, a device may band together multiple such grids for LDPC decoding of an extended code. For example, the decoder can extend Z to 2Z to perform decoding on a lifting extended by a factor of 2. The decoder may take one column each 412 from two Z×24 memories 410, and permute the combined concatenated columns to align with corresponding 2Z check nodes which may be viewed as two copies of Z check nodes. The decoder may then subtract messages d obtained from the saved compressed check output to obtain updated check node input messages 414. The decoder may then perform parallel processing (for example, 2Z parallel check node processing) to obtain the decoded messages 416 ($d'$). Decoding the extended codes described herein may have reduced decoder complexity at least in part due to the reuse of the Z-parallel structure. If the permutation of the 2Z concatenated elements is a cyclic permutation, then implementation of the 2Z cyclic permutation cannot be significantly facilitated by existing permutation operations of size Z. Techniques described herein may achieve improved hardware reuse by decomposing the 2Z vectors in an alternate fashion.

Figure 5:
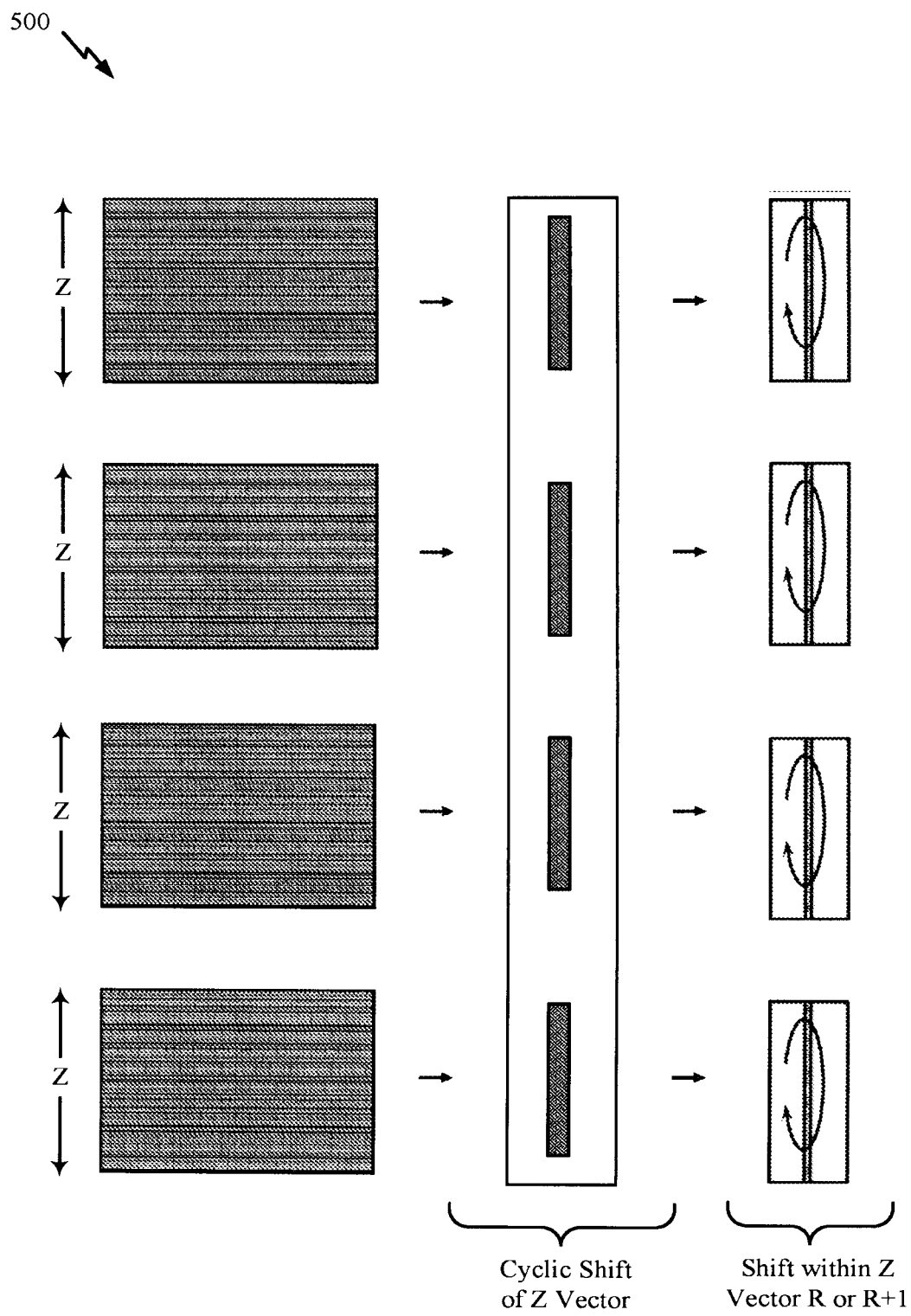
FIG. 5 shows an example of a cyclic lifting procedure performed on a first lifted code that supports extending LDPC codes for Wi-Fi.

FIG. 5 shows an example of an efficient extended cyclic lifting 500, illustrated in this example figure by a factor of 4, performed as a two-step process consisting of block-wise cyclic shifting of Z vectors followed by cyclic shifting within the vectors. For example, if a first lifted code with cyclic permutation R associated to a lifted edge, then, in some examples, the extended cyclic lifting reuses the cyclic shift by R on the smaller Z vectors, but may also implement a cyclic shift of R+1. In this extension, the four copies of columns of size Z may be interleaved to form the 4Z bit vector, and may not be concatenated. In some examples, the cyclic lifting 500 may be performed at or by one or more wireless devices described herein.

LDPC codes used for different implementations (such as Wi-Fi) may be designed using liftings of base graphs. For example, some LDPC codes used for Wi-Fi implementations may utilize a cyclic group for lifting (for example, the length 1944 codes may use a lifting size Z=81). To support extended LDPC codes via re-lifting of existing codes, different groups may be used (such as, for example, cyclic lifting, product lifting, swapping-based lifting, among other liftings in the design of LDPC codes). For example, an extended length Lx1944 codeword may have a combined lifting size Z'=L×Z, and the lifting used for the length Lx1944 codeword may be a cyclic lifting. In some implementations, a device may perform re-lifting and extending of the Wi-Fi code using a second cyclic lifting step.

The extension of permutations associated with liftings described herein may be defined using inner representation or outer representation. Depending on the group structure associated to the extension, an inner representation may be used to preserve the hardware structure used for the current codes to support efficient hardware implementation. Specifically, a current code (supported by hardware) may be recoverable from the extended code, such that the extended code is supported by hardware that supports the first lifting. In one example, a base graph re-lifting by L=4 to obtain Z'=4×81=324 may take a Wi-Fi code (which copies a base graph 81 times), and copy it 4 times more. If the original lifting of an edge is R, representing a cyclic permutation by R<Z. and the extended lifting is also cyclic, then a cyclic permutation using an inner extension to obtain a cyclic permutation value 4R+z, where z is 0, 1, 2, or 3, for the extended permutation, which may preserve the original permutation of size R on Z vectors, as illustrated in FIG. 5.

In some examples, each of the lifted nodes corresponding to a base node may be indexed by an integer x between 0 and 323 (for example, Z'=324). Each of the nodes may be equivalently identified by a pair of integers (a,b), where a is between 0 and 80, and b is between 0 and 3. These integer pairs may allow for interpreting extended lifted bit vectors in a different bit order than a bit order generally associated with cyclic lifting. The integer pair indexing may facilitate the decomposition of the extended lifting that preserves the structure of the original lifting. In some examples, nodes may be identified by the pairs (a,b), where "a" may correspond to the node selected within a Z=81 copy associated to a first lifting, and "b" may correspond to a selection among the L=4 copies of the Z=81 copies in the first lifting. To convert between the two node representations of x and (a,b), a device may use an inner representation and an outer representation. The inner representation may convert between x, a, and b using the equation: x=4a+b. In such inner representation cases, a=x/4 (where a may be rounded down to a nearest integer). The outer representation may convert between x, a, and b using the equation x=81b+a, where a=(x mod 81).

In some examples, the extended LDPC code may use a cyclic lifting. For implementations of cyclic lifting, the index of the lifted variable nodes may be denoted as $v_n$, and check nodes may be denoted as $c_n$. $v_n$, where $v_n$ and $c_n$ are integers between 0 and 323. For a cyclic lifting of value y, the variable node $v_n$ is connected to check node as $c_n=(v_n+y)$ mod 324.

The extended lifting indexes and associated cyclic permutations can be represented using integer pairs to represent a first lifting and second lifting factor. One example of using a cyclic lifting using the (a,b) representation and an outer extension may be illustrated as follows:

$$v_n = 81b + a, \ y = 81b' + a', \text{ and } c_n = 81b'' + a'',$$

where "b" is 0, 1, 2, or 3 and "a" is 0, . . . , 80. In this form, "a" represents a first lifting and "b" represents a second lifting. The second lifting value is in the higher order digits and the first lifting value is in the lower order digits.

One other example of a cyclic lifting using the (a,b) representation and an inner extension may be illustrated as follows:

$$v_n = 4a + b, \ y = 4a' + b', \text{ and } c_n = 4a'' + b'',$$

where "b" is 0, 1, 2, or 3, and "a" is 0 . . . 80. Here "a" represents a first lifting and "b" represents a second lifting. The second lifting value is in the lower order digits and the first lifting value in the higher order digits.

For the inner extension, using $c_n=(v_n+y)$ mod 324, which gives a"=(a+a'+(b+b')/4) mod 81, b"=(b+b') mod 4, where (b+b')/4 divides (b+b') by 4 and rounds down to the nearest integer. In such examples, b" may not depend on a or a'.

The cyclic group, which characterizes cyclic lifting, "almost factors" into independent operations on a's and b's because for both representations, only one of the coordinates is independent of the other one. In some implementations, all variable nodes $v_n$ with the same b value in the (a,b) presentation to be mapped to check nodes $c_n$ with the same b" in the (a",b") representation. In such cases, the representation of b" may be independent of a and a', and the inner representation satisfies this, b"=(b+b') mod 4.

In another example, a second lifting may be applied to a first lifting to extend an LDPC code. The first lifting may be a cyclic lifting of size Z, where each permutation matrix that replaces a "1" in the base parity check matrix is a power of the shift matrix. Then, for the second lifting, the first cyclic shift is made larger as Z'=LZ (for example, Z'=2×, 4×, 8× or 16× larger with L=2, 4, 8, or 16). If the first cyclic shift was a then the extended shift may be written as a+Z*b, where b is 0, 1, . . . , L−1. The original cyclic shift may then be recovered from the extended shift by taking the value modulo Z. When the inner cyclic extension is used, a cyclic shift value may be written as La+b, and, when L is a power of 2, the original first cyclic shift may be recovered by removing the L lowest order bits in a binary representation.

As illustrated in FIG. 5, multiple grids Z may be banded together for performing the cyclic lifting and for LDPC decoding. For example, the decoder can extend Z to 4Z, and may perform a cyclic shift of the entire 4Z vector. The decoder may take four columns one each of the four Z-wide memories, and permute the columns to align with corresponding check nodes. If the 4Z vector order is given by the (a,b) notation where "a" selects within a Z vector and "b" is equal to 0, 1, 2, or 3 and selects among the for copies and the overall cyclic permutation is 4R+b' for some b', then the decoder may perform the cyclic shift by first performing a cyclic shift of size b' among the 4Z vectors followed by a cyclic shift of value R or R+1 within the Z vectors. At least one of the Z vectors may use the cyclic shift R. If R is the value of the first lifting, then in this implementation it is largely preserved as an operation on the Z vectors in the implementation of the cyclic shift on 4Z vectors. In some examples, the device may perform an additional vector-wide identity shift for banding, where the setting of pass-through, which implements an identity permutation, reverts the structure to four separate decoders. If b'=0, then in at least some examples the Z vectors are not permuted among them and each Z vector undergoes the cyclic permutation by R. In such examples, the structure may be used to decode 4 of the first liftings in parallel. By relaxing the synchronization of the parallel operation and allowing distinct permutations in the 4 copies, 4 independent decoders of the first lifting would be recovered.

Figure 6:
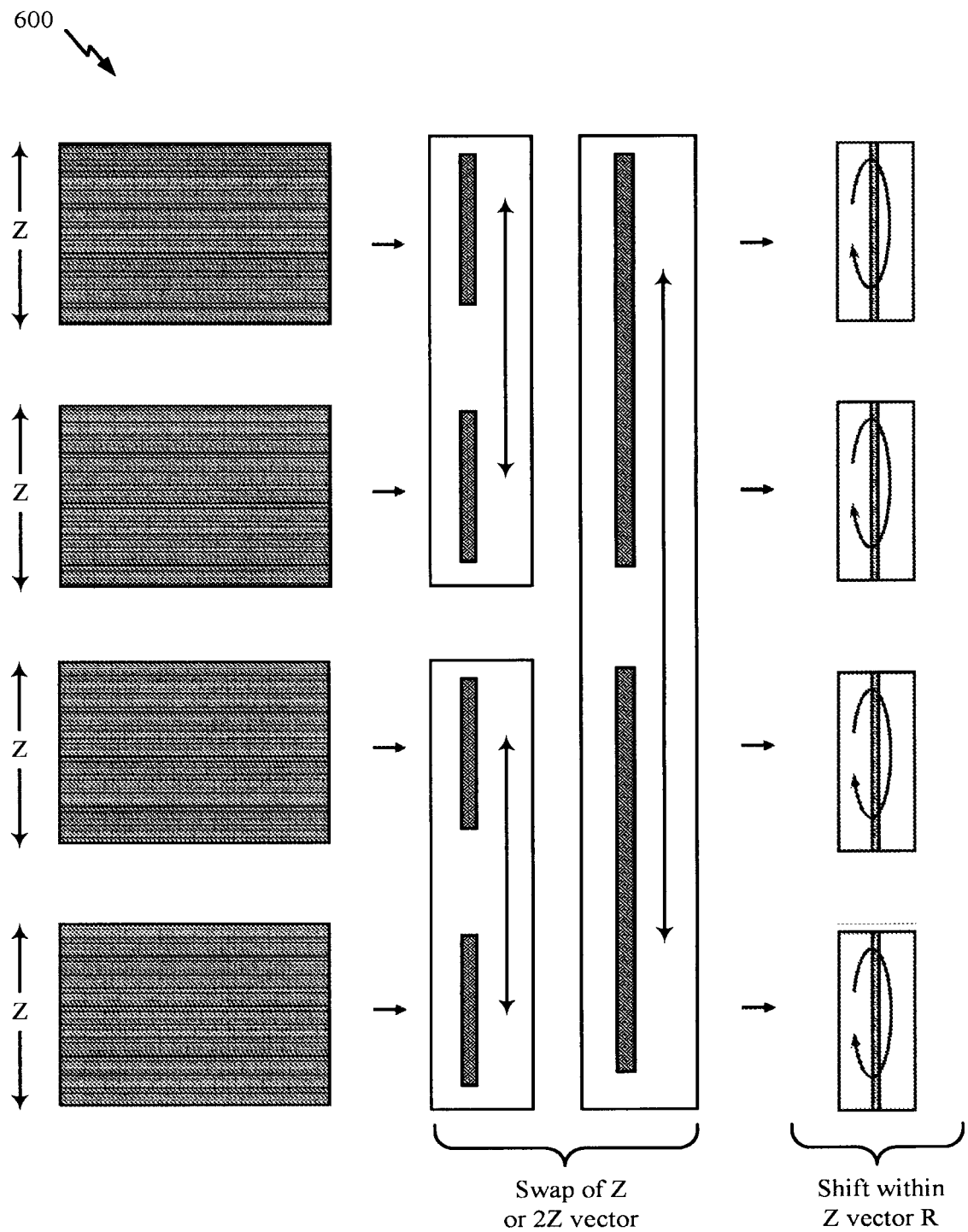
FIG. 6 shows an example of a product lifting procedure performed on a first lifted code that supports extending LDPC codes for Wi-Fi.

FIG. 6 shows an example of a product lifting performed at a first lifted code that supports extending LDPC codes for Wi-Fi. In some examples, the product lifting 600 may be performed at or by one or more wireless devices described herein. In a product lifting, the lifting extension may be achieved by performing an independent permutation on Z vectors while leaving the permutation within each Z vector identical. In this implementation, each permutation on a Z vector may be equal to the first lifting value while the larger lifting structure is achieved via the permutation among the Z vectors.

In addition to cyclic lifting, some LDPC codes used for Wi-Fi implementations may utilize product lifting or swapping lifting (which may be a type of product lifting) to extend current LDPC codes (by re-lifting and extending the Wi-Fi code using a second separate cyclic lifting or swapping lifting step, which could be a cyclic shift of size 2 or more generally a shift of size $2^k$ consisting of a k dimensional cyclic shift, each of size 2), which may also be described using inner representation or outer representations. For example, inner representation may preserve the hardware structure used for the current codes to support efficient hardware implementation. Specifically, a current code (supported by hardware) may be recoverable from the extended code, such that the extended code is also supported by the hardware. In implementations of a product lifting the first and second lifting may be independent. In such examples, the first lifting structure may be preserved whether the representation of the extension is an inner or outer representation. In addition, the enumeration of the bits in the extended bit vectors may correspondingly be aligned with an inner or outer extension to support recovery of the first lifting as a component of the extended lifting.

In transmission of LDPC codewords using the first lifting, such as in Wi-Fi, the bits in the LDPC codeword are mapped to symbols, such as QAM constellations. The LDPC codeword bits may be enumerated for such a mapping and the enumeration exploits the lifted structure of the codeword. The LDPC codeword consists of Z*V bits where V is a number of base variable nodes, for example V=24 for some Wi-Fi implementations. The Z*V bits may also be arranged in a Z×V two-dimensional array. The selection of the bits for mapping to transmission symbols, for example constellation mapping, may occur in either a row-wise or column-wise priority. For extended LDPC codes, this enumeration may include a first enumeration in the Z dimension followed by the V dimension regardless of the mapping performed. This corresponds to column-wise enumeration of the two-dimensional array. The bits of extended LDPC codewords may be viewed as a multiple, for example, a multiple of L times, of the two-dimensional arrays and to facilitate reuse of the pre-existing transmission structure the ordering within the Z dimension may be preserved. The mapping of the extended codeword to transmission resources may mimic the mapping that may occur for the corresponding multiple of first lifted codewords.

In some examples, the size of the set of admitted edge permutations and the size of the lifting may be identical, for example, equal to Z. Z-vectors arising from the lifting, whether lifted base variable nodes, check nodes, or edges, may be indexed by an integer 0, 1, . . . , Z−1 and the permutations associated to the lifted base edges may also be represented by such integers. For extended liftings comprising a first and second lifting, the extended lifting may be identified by a pair of integers in which one element of the pair represents the first lifting step and the other element represents the second lifting step. The two integers may be combined into a single integer to represent the extended lifting and the method of combining is related to the interpretation of the extended lifting.

There may be one or more ways of combining the two integers corresponding to an inner extension and an outer extension, respectively. In an inner extension, the value of the second lifting may be placed in the lower order portions of the combined value and in an outer lifting, the second lifting value may be placed in the higher order portions of the combined value. The choice of inner vs. outer extension reflects on bit order in codeword transmission and in architectural decomposition of the extended lifting. In some examples, each of the extended lifted nodes, edges, or permutations, may correspond to an integer x between 0 and 323 (for example, Z'=324), and each of the vector elements may be also identified by a pair of integers (a,b), where "a" is between 0 and 80, and "b" is between 0 and 3. When identifying the elements by the pairs (a,b), "a" may correspond to the selection within a Z=81 first lifting, and "b" may correspond to selection within a second lifting of size 4. To convert between the two representations of x and (a,b), a device may use an inner representation and an outer representation. The inner representation may convert between x, a, and b using the equation: x=4a+b. In such inner representation cases, a=x/4 (where a may be rounded down to a nearest integer). The outer representation may convert between x, a, and b using the equation x=81b+a, where a=(x mod 81). The permutations associated to extended lifted edges may also be represented by such a pair (a',b') which thereby represents a permutation on such pairs. In some examples, an LDPC code may be extended using a product lifting, where the two elements representing a permutation act independently on their respective elements of, for example, a node pair, to determine the extended permutation. In this example, the extended lifting factors into the first and second lifting. In other examples, the second lifting may be a swapping lifting which is a form of product lifting in which the second lifting performs pairwise swaps of vectors. In other examples the extended lifting is a cyclic lifting which is not a product lifting. In such examples, the two elements of the lifting pair representation may not act independently.

A product lifting may be defined using operation directly on the a's and b's, for example, the permutation (a,b) may act on (a',b') to yield (a",b") via: a"=(a+a') mod 81, and b"=(b+b') mod 4. In this example, the first and second lifting are both cyclic liftings and the extended lifting is the product of those two cyclic liftings. For LDPC codes designed using product lifting, a's and b's may be combined using the outer representation or the inner representation, where the permutation used in the lifting is defined separately on a's and b's. The two representations may be equivalent in this example, in that they define the same lifting operation. It should be noted, however, to facilitate the hardware reuse enable by the extended lifting the codeword bit order may be taken as in an inner extension. If an outer extension is used to represent the liftings, then, while the first and second permutations are independently represented, the preferred bit order for codeword bits would still be in inner extension order. For this reason an inner extension representation of the lifting values may be used.

The integer index of the lifted variable nodes may be denoted as $v_n$, and the integer index of check nodes may be denoted as $c_n$. In some examples, $v_n$ and $c_n$ may be integers between 0 and 323. In some examples, the inner representation for a lifting may allow for the values of $v_n$ and $c_n$ to be described in binary forms, where the value of b can be directly obtained by the least significant bits (LSBs) of $v_n$=4a+b, and the value of a can be converted from most significant bits (MSBs).

In some other examples, a device may implement swapping lifting to extend LDPC codes. In such examples, x may be represented by a triple of integers with (a,b,c) where the second lifting is comprised of two successive liftings of size 2, or, equivalently, the second lifting is itself a product lifting with two factors where "a" is an integer between 0 and 80, representing the first lifting, for example, an existing Wi-Fi lifting, and b and c are both 0 or 1, and for the inner representation, x=4a+2b+c. The swapping lifting operation corresponding to permutation (a,b,c) that takes a node index (a',b',c') to (a",b",c") may be defined as:

$$a'' = (a + a') \mod 81$$
$$b'' = (b + b') \mod 2$$
$$c'' = (c + c') \mod 2.$$

After defining the lifting for the Z'=4×81 case using the swapping lifting, the lifting for the Z=2×81 case may be obtained by dropping c, and the lifting for the original Z=81 case may be obtained by dropping both b and c, and keeping only a. Additionally or alternatively, for other cases (for example, the Z=2×4×81=8×81 case), an additional bit "d" may be introduced and defined as d"=(d+d') mod 2 similar to the definition of b and c.

As illustrated in FIG. 6, multiple grids of height Z, representing for example memory storage for first lifted LPDC codes, may be banded together for performing the extended lifted LDPC operations involving product and swapping extended liftings. For example, the decoder may extend Z to 42, and may perform a swap of the entire Z or 2Z vector. The decoder may take four columns one each of the four Z-wide memories, and permute the columns to align with corresponding check nodes. The decoder may perform a shift (such as R) within the Z vectors where R is the permutation value associated to the first lifting. In some examples, the device may perform an additional vector-wide shift for banding, where the setting of pass-through reverts the structure to four separate decoders.

Figure 7:
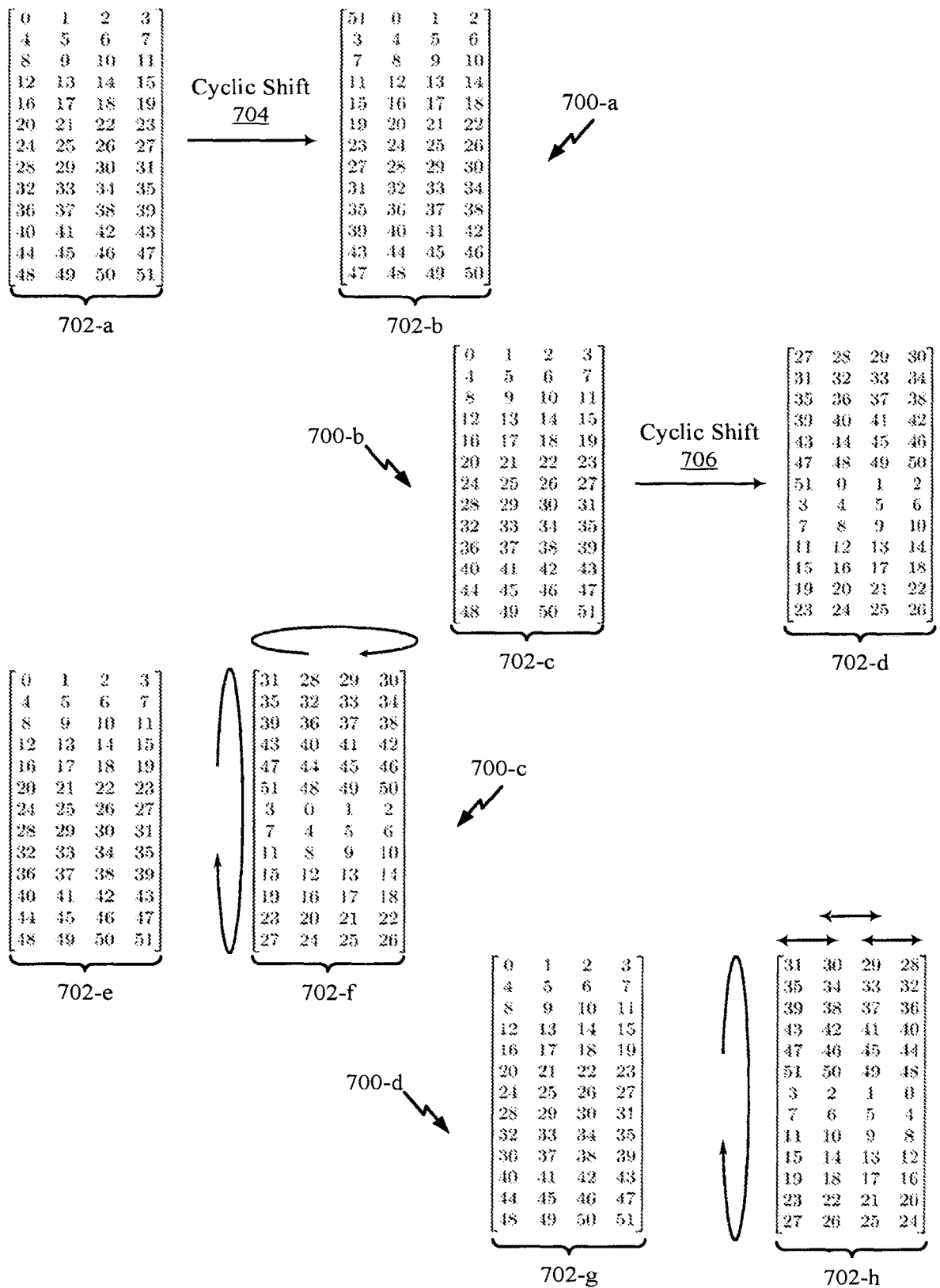
FIG. 7 shows example cyclic permutations which illustrate cyclic shift operations that support extending LDPC codes for Wi-Fi.

FIG. 7 shows example cyclic permutations 700-a, 700-b, 700-c, and 700-d, which illustrate cyclic shift operations that support extending LDPC codes for Wi-Fi. In some examples, the cyclic permutations may be associated with cyclic lifting as described herein and may be performed at or by one or more wireless devices described herein.

LDPC codes used for different implementations (such as Wi-Fi) may be designed using lifting and re-lifting, for example, some codes may utilize a cyclic group for lifting. To support extended LDPC codes via re-lifting of existing codes, different groups may be used (such as, for example, a cyclic group). In some implementations, a device may perform re-lifting and extending of the Wi-Fi code using a second cyclic lifting step.

Cyclic permutation example 700-a may show an approximate factoring of a cyclic group where Z=13. For example, a matrix 702-a may undergo a column to rows permutation and a cyclic shift 704 (which may be a cyclic shift by 1) to produce a shifted matrix 702-b. In such cases, the columns may be shifted cyclically, and the rows may cyclically shift down upon wrap around.

Cyclic permutation example 700-b may show an interleaved case where, during the cyclic shift 706, each of the rows of matrix 702-c undergo a cyclic shift of b=(K/4), where (K/4) denotes the integer obtained by rounding down $K/4.$, and each of the columns of matrix 702-c undergoes a cyclic shift of a=(K/4) or a=(K/4)+1 to produce the matrix 702-d. In such interleaved cases, K may be equal to 4*(K/4)+(K/4).

Cyclic permutation example 700-c may show an example cyclic product case which illustrates a true factoring product of cyclic shifts. For example, each column of the matrix 702-e may undergo a same rotation to produce the shifted matrix 702-f. Additionally or alternatively, each row of the matrix 702-e may undergo a same rotation to produce the shifted matrix 702-f. In such examples, the shifted matrix 702-f may be a product of cyclic liftings. In addition, the column permutations of the matrix 702-f may be the same as current 802.11 values.

Cyclic permutation example 700-d may show an example swapping case (for example, a 3D product cyclic case) which illustrates an additional or alternative cyclic product case. For example, each column of the 702-g matrix may undergo the same rotation to produce the shifted matrix 702-h. Additionally or alternatively, each row of the matrix 702-g may undergo a same rotation to produce the shifted matrix 702-h. The product cyclic example of 700-d may support multiple product cyclic lifting, where column permutations may be the same as current 802.11 values. In addition, the product cyclic example of 700-d may implement swapping switch structure instead of a fully cyclic structure (such as a structure equivalent to 2D product cyclic structure).

FIG. 8 shows example which illustrates block sub-matrix recovery examples 800-a, 800-b, and 800-c of a first lifting that supports extending LDPC codes for Wi-Fi.

In a first example 800-a, a basic cyclic shift may be implemented. For shift matrix 802-a (matrix S), the first lifting may be a cyclic lifting of size Z (for example, Z may be equal to an integer, such as Z=7 in the example 800-a). In such examples, each permutation matrix that replaces a "1" entry in the base parity check matrix may be a power of the shift matrix 802-a. For example, if the cyclic shift 804 is a cyclic shift of 3, then the shifted matrix 802-b (matrix S3) may be cyclically shifted as shown.

Additionally, in example 800-b, the cyclic shift may be made larger (for example, one or more times larger, such as four times larger or any other integer multiple times larger). If the first cyclic shift is "a" then the extended cyclic shift may be represented as a+Z*b where "b" is 0, 1, 2 or 3, for an outer extension representation. In such cases for an outer extension, "a" (the first cyclic shift) may be recovered by taking the value of modulo Z. For example, if Z=7, a=3 and b=2, then the extended permutation matrix may be obtained by replacing each 0 in the matrix S3 with a 4×4 zero matrix and each 1.

Example 800-b may illustrate an inner cyclic extension 806, where the cyclic shift value is equal to 4a+b. For example, if b=2 then the codeword is reordered, and the new permutation matrix is where each submatrix is Z×Z, and $S^a$ is a block-wise sub-matrix that may be recoverable from the permutation matrix.

Example 800-c may illustrate an inner representation product extension where the extended permutation matrix is a Kronecker product of two permutation matrices, one each from two lifting steps. For example, the second lifting factor may be on the left of the product. In such cases, the permutation matrix is extended by 4 with a cyclic shift of 2 to produce the permutation matrix associated with the inner product extension 808. Here, $S^a$ may be a block-wise sub-matrix that may be recoverable from the permutation matrix. Additionally or alternatively, the matrix structure associated with the swapping permutation 810 may be obtained by taking a swapping permutation for the second step (of size 4). In either example, the second lifting (for example, the product, cyclic, or swapping liftings) may support block-submatrix recovery ($S^a$) of the first lifting.

Figure 9:
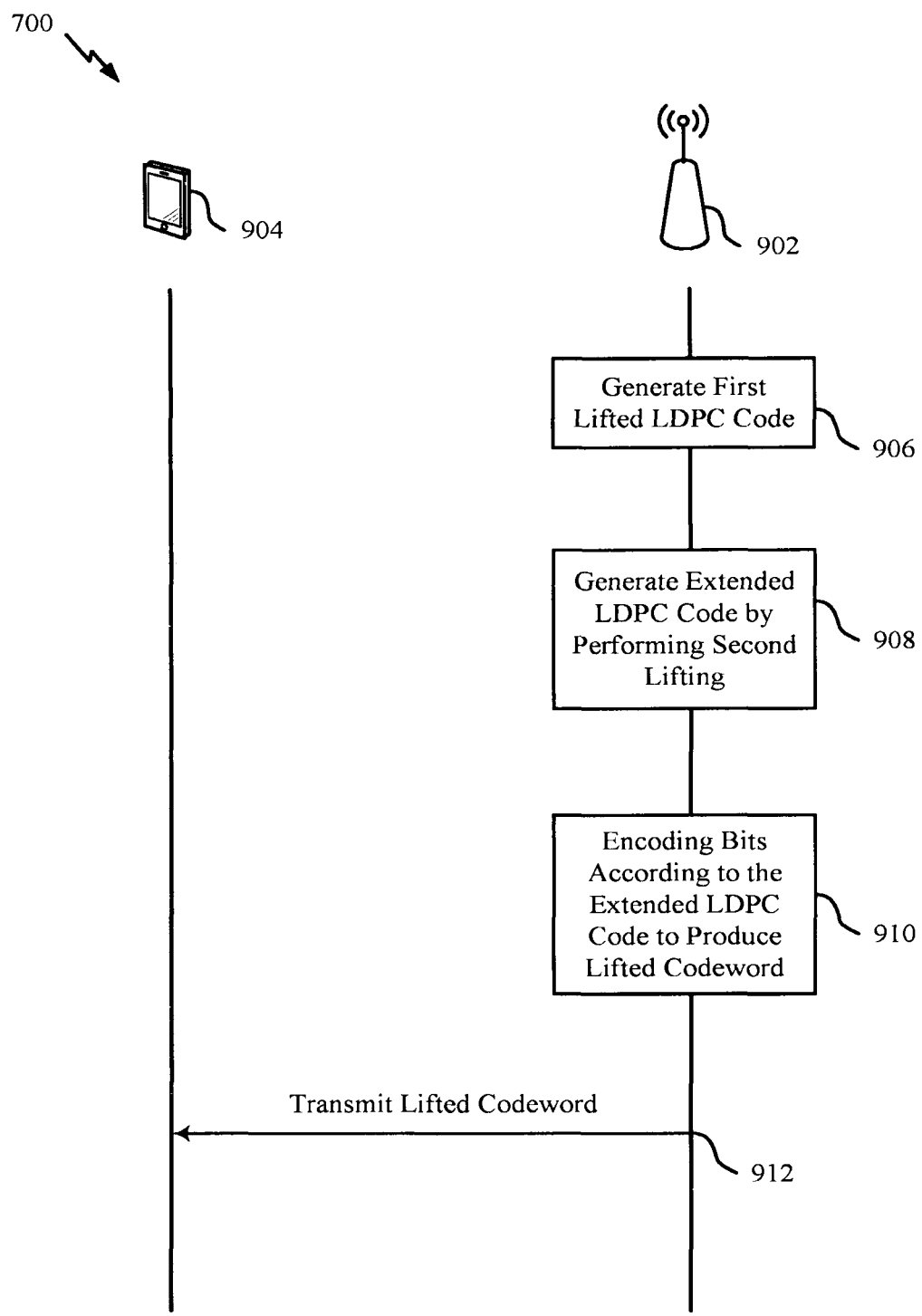
FIG. 9 shows an example of a process flow of signaling between wireless devices over a wireless link that supports extending LDPC codes for Wi-Fi.

FIG. 9 shows an example of a process flow 900 which illustrates signaling between wireless devices over a wireless link and that supports extending LDPC codes for Wi-Fi. The process flow 900 may implement or may be implemented to realize or facilitate aspects of the wireless communication network 100. For example, the process flow 900 illustrates communication between a first wireless device 902 and a second wireless device 904, which may be examples of corresponding wireless devices described herein. The first wireless device 902 and the second wireless device 904 as illustrated by and described with reference to FIG. 9 may be examples of corresponding devices illustrated and described herein, including with reference to FIG. 1.

In the following description of the process flow 900, the operations may be performed (such as reported or provided) in a different order than the order shown, or the operations performed by the example devices may be performed in different orders or at different times. Some operations also may be left out of the process flow 900, or other operations may be added to the process flow 900. Further, although some operations or signaling may be shown to occur at different times for discussion purposes, these operations may actually occur at the same time.

At 906, the first wireless device 902 may generate a first low-density parity check matrix and a first low-density parity check code by performing a first lifting on a base matrix.

At 908, the first wireless device 902 may generate an extended low-density parity check code corresponding to an extended low-density parity check matrix and by performing a second lifting on the first low-density parity check matrix. For example, performing the second lifting may allow lifted permutation matrices associated with base edges of the first low-density parity check matrix to be recoverable as block-wise sub-matrices of the one or more lifted permutation matrices associated with respective base edges of the extended low-density parity check matrix. For example, a second lifting permutation for a base edge of the base edges of the first low-density parity check matrix may be associated with one or more, for example Z, lifted variable nodes and one or more check nodes from first liftings. In such examples, the extended low-density parity check code may be an extension of the first low-density parity check code (that is, the extended low-density parity check code may be longer than the first low-density parity check code based on the second lifting).

In some examples, the extended low-density parity check matrix may be associated with a two-step lifting that includes a first lifting step and a second lifting step, where the second lifting step is applied to a result of the first lifting step to produce an extended lifting. The two-step lifting may include a process of generating an integer pair (for example, an (a, b) integer pair) to identify one or more images of first low-density parity check lifted bit vectors within respective extended lifted low-density parity check bit vectors. The first integer of the integer pair may in some examples correspond to the first lifting step and a second integer of the integer pair may correspond to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within an extended low-density parity check lifted bit vector.

The LDPC codeword bits may be enumerated for such a mapping and the enumeration exploits the lifted structure of the codeword. For example, for extended LDPC codes, this enumeration may include a first enumeration in a Z dimension followed by a V dimension regardless of the mapping performed. This corresponds to column-wise enumeration of a two-dimensional array, which may include the codeword bits. The bits of extended LDPC codewords may be viewed as a multiple of the two-dimensional arrays and to facilitate reuse of the pre-existing transmission structure the ordering within the Z dimension may be preserved.

The first wireless device 902 may perform the first lifting step and the second lifting step in accordance with an inner extension or an outer extension of the first lifting to produce the extended low-density parity check code. In some examples that the second lifting step is performed in accordance with the inner extension, second lifting step may retain first low-density parity check liftings as a sub-component of extended low-density parity check liftings. For example, based on the first lifting being recoverable from the second lifting via an application of a bit mask, a modulo operation, or both. In some other examples that the second lifting step is performed in accordance with the outer extension, the second lifting step may retain first low-density parity check liftings as a sub-component of extended low-density parity check liftings based on the first lifting being recoverable from the second lifting via an application of a modulo operation. In some examples, the first lifting step may be related to the second lifting step via a lifting factor and a modulo operation.

In some implementations, the first lifting (corresponding to the first integer of the integer pair) is independent from the second lifting (corresponding to the second integer of the integer pair) in accordance with a product lifting. Additionally or alternatively, the block-wise sub-matrices corresponding to a permutation of an image of the first lifting are identical sub-matrices. In some other implementations, the first wireless device 902 may perform a swapping lifting, where the first wireless device 902 swaps at least two images of the one or more images of the first low-density parity check code during the first lifting step or the second lifting step.

In some examples, the extended low-density parity check code includes one or more images of lifted low-density parity check codes including at least the first low-density parity check code that is recoverable from the extended low-density parity check code. In such cases, the first low first low-density parity check code structure may be preserved in the extended low-density parity check code.

At 910, the first wireless device 902 may encode a first set of bits according to the extended low-density parity check matrix and the extended low-density parity check code, which may produce a lifted codeword for transmission.

At 912, the first wireless device 902 may perform a transmission of the lifted codeword to the second wireless device 904.

Figure 10:
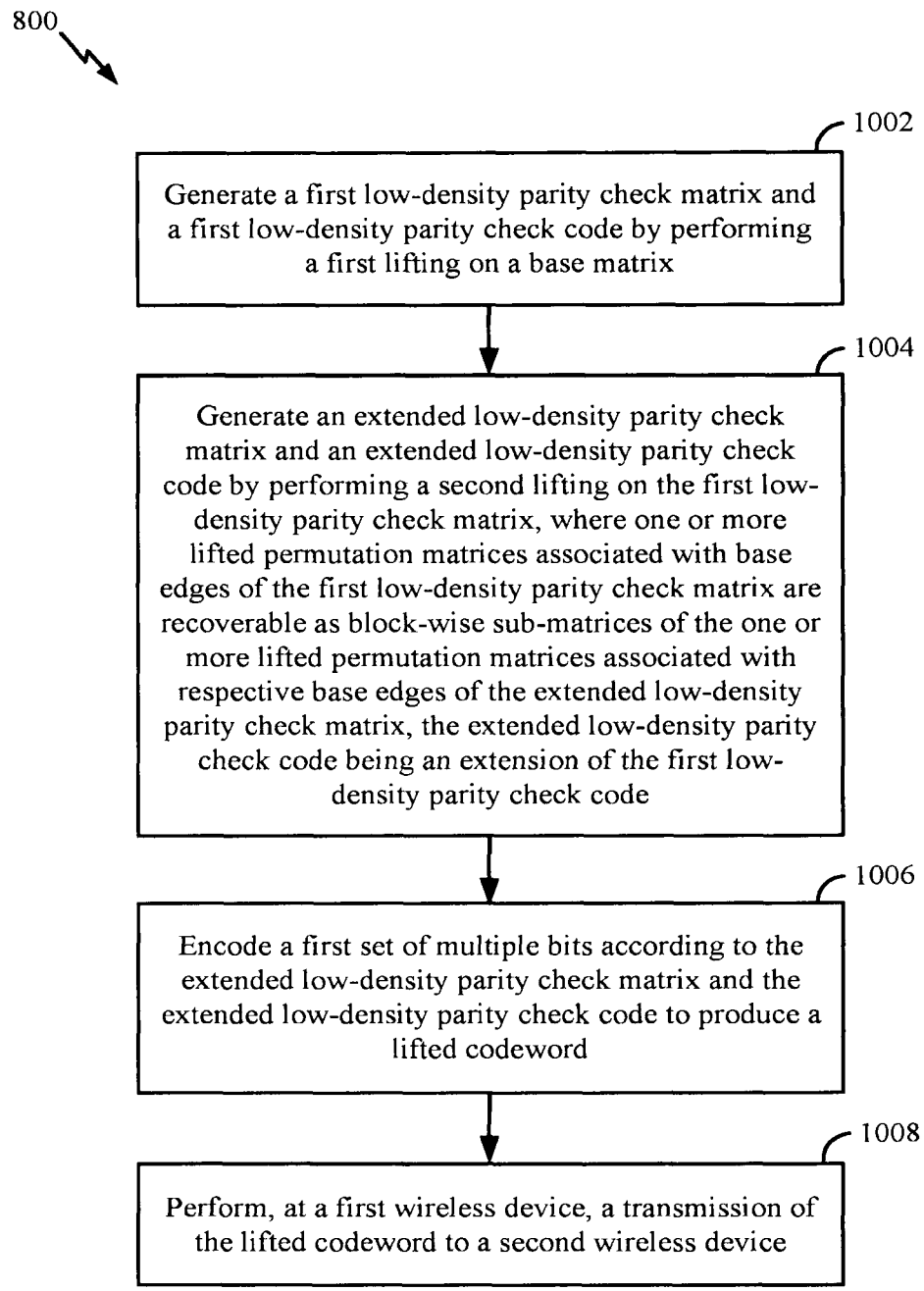
FIG. 10 shows a flowchart illustrating an example process performable by a wireless device that supports extending LDPC codes for Wi-Fi.

FIG. 10 shows a flowchart illustrating an example process 1000 performable at a wireless device that supports extending LDPC codes for Wi-Fi according to some aspects of the present disclosure. The operations of the process 1000 may be implemented by a wireless device such as a wireless receiving device (for example, a wireless AP or a non-AP STA) or its components as described herein. For example, the process 1000 may be performed by a wireless communication device, such as the wireless communication devices described with reference to FIGS. 1 and 2, operating as or within a wireless AP or a wireless STA. In some examples, the process 1000 may be performed by a wireless AP such as one of the APs 102 described with reference to FIG. 1.

In some examples, at block 1002, the wireless device may generate a first low-density parity check matrix and a first low-density parity check code by performing a first lifting on a base matrix. The operations of 1002 may be performed in accordance with examples as disclosed herein. In some examples, aspects of the operations of 1002 may be performed by a first lifting component 1202 as described with reference to FIG. 12.

In some examples, at block 1004, the wireless device may generate an extended low-density parity check matrix and an extended low-density parity check code by performing a second lifting on the first low-density parity check matrix, where one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code. The operations of 1004 may be performed in accordance with examples as disclosed herein. In some examples, aspects of the operations of 1004 may be performed by a second lifting component 1204 as described with reference to FIG. 12.

In some examples, at block 1006, the wireless device may encode a first set of multiple bits according to the extended low-density parity check matrix and the extended low-density parity check code to produce a lifted codeword. The operations of 1006 may be performed in accordance with examples as disclosed herein. In some examples, aspects of the operations of 1006 may be performed by an LDPC encoding component 1206 as described with reference to FIG. 12.

In some examples, at block 1008, the wireless device may perform a transmission of the lifted codeword to a second wireless device. The operations of 1008 may be performed in accordance with examples as disclosed herein. In some examples, aspects of the operations of 1008 may be performed by an LDPC encoding component 1206 as described with reference to FIG. 12.

Figure 11:
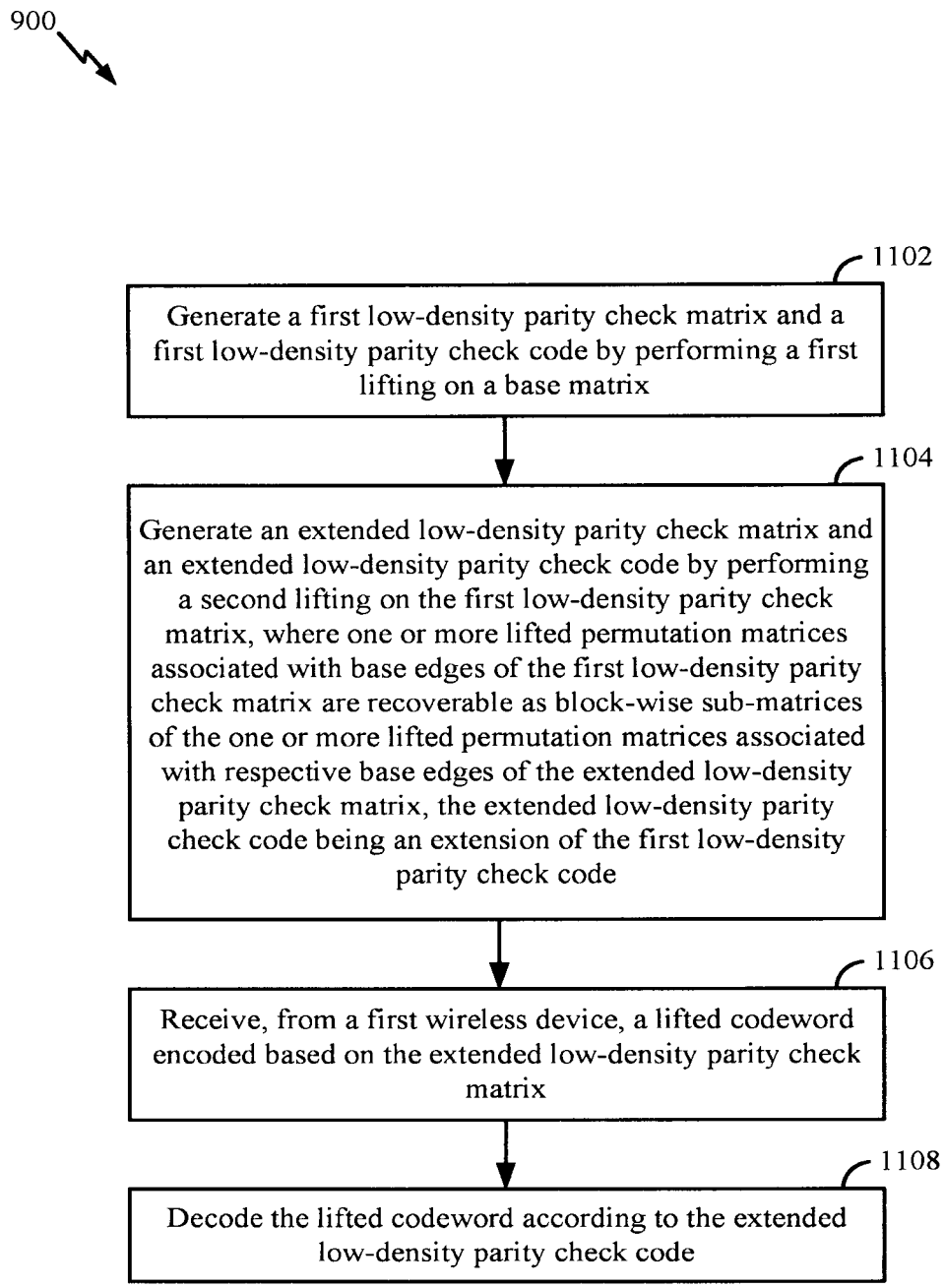
FIG. 11 shows a flowchart illustrating an example process performable by a wireless device that supports extending LDPC codes for Wi-Fi.

FIG. 11 shows a flowchart illustrating an example process 1100 performable at a wireless device that supports extending LDPC codes for Wi-Fi according to some aspects of the present disclosure. The operations of the process 1100 may be implemented by a wireless device such as a wireless STA or its components as described herein. For example, the process 1100 may be performed by a wireless communication device, such as the wireless communication devices described with reference to FIGS. 1 and 2, operating as or within a wireless device. In some examples, the process 1100 may be performed by a wireless device such as one of the STAs 104 described with reference to FIG. 1.

In some examples, at block 1102, the wireless device may generate a first low-density parity check matrix and a first low-density parity check code by performing a first lifting on a base matrix. The operations of 1102 may be performed in accordance with examples as disclosed herein. In some examples, aspects of the operations of 1102 may be performed by a first lifting component 1302 as described with reference to FIG. 13.

In some examples, at block 1104, the wireless device may generate an extended low-density parity check matrix and an extended low-density parity check code by performing a second lifting on the first low-density parity check matrix, where one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code. The operations of 1104 may be performed in accordance with examples as disclosed herein. In some examples, aspects of the operations of 1104 may be performed by a second lifting component 1304 as described with reference to FIG. 13.

In some examples, at block 1106, the wireless device may receive, from a first wireless device such as an AP, a lifted codeword encoded based on the extended low-density parity check matrix. The operations of 1106 may be performed in accordance with examples as disclosed herein. In some examples, aspects of the operations of 1106 may be performed by a decoding component 1306 as described with reference to FIG. 13.

In some examples, at block 1108, the wireless device may decode the lifted codeword according to the extended low-density parity check code. The operations of 1108 may be performed in accordance with examples as disclosed herein.

In some examples, aspects of the operations of 1108 may be performed by a decoding component 1306 as described with reference to FIG. 13.

Figure 12:
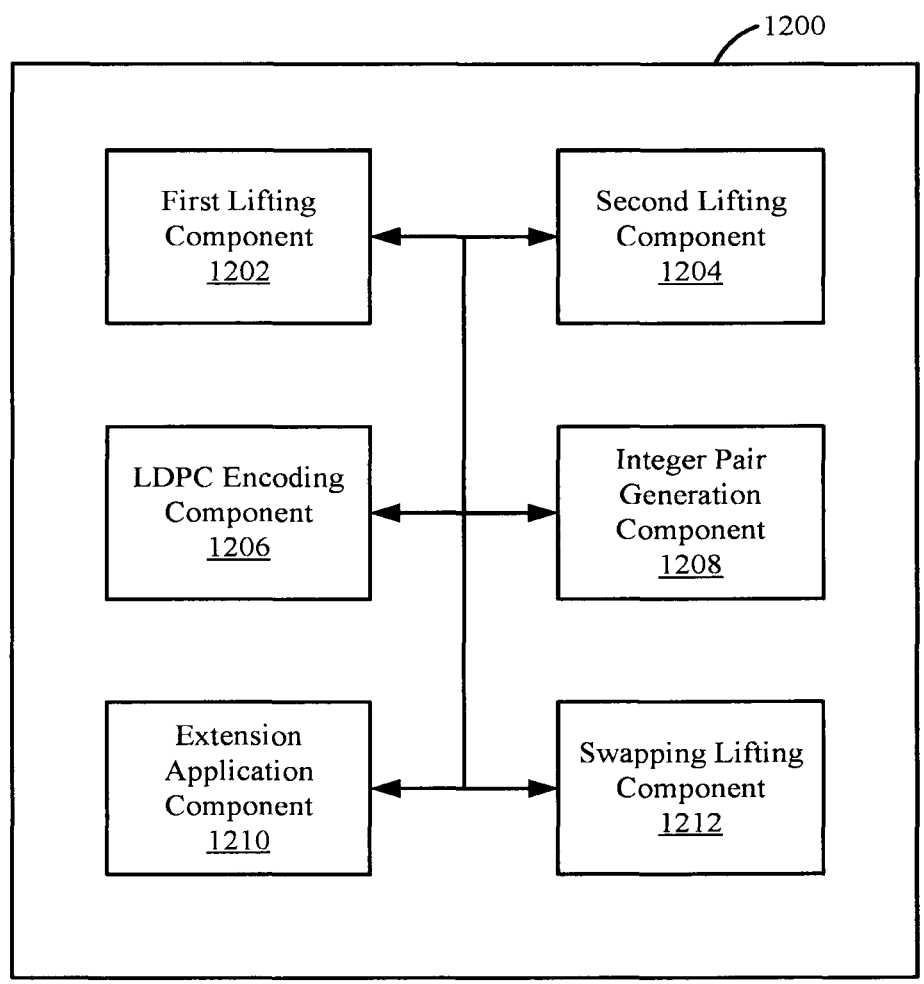
FIG. 12 shows a block diagram of an example wireless communication device that supports extending LDPC codes for Wi-Fi.

FIG. 12 shows a block diagram of an example wireless communication device 1200 that supports extending LDPC codes for Wi-Fi according to some aspects of the present disclosure. In some examples, the wireless communication device 1200 is configured or operable to perform the process 1000 described with reference to FIG. 10. In various examples, the wireless communication device 1200 can be a chip, SoC, chipset, package or device that may include: one or more modems (such as a Wi-Fi (IEEE 802.11) modem or a cellular modem such as 3GPP 4G LTE or 5G compliant modem); one or more processors, processing blocks or processing elements (collectively "the processor"); one or more radios (collectively "the radio"); and one or more memories or memory blocks (collectively "the memory").

In some examples, the wireless communication device 1200 can be a device for use in an AP, such as AP 102 described with reference to FIG. 1. In some other examples, the wireless communication device 1200 can be an AP that includes such a chip, SoC, chipset, package or device as well as multiple antennas. The wireless communication device 1200 is capable of transmitting and receiving wireless communications in the form of, for example, wireless packets. For example, the wireless communication device can be configured or operable to transmit and receive packets in the form of physical layer PPDUs conforming to one or more of the IEEE 802.11 family of wireless communication protocol standards. In some examples, the wireless communication device 1200 also includes or can be coupled with an application processor which may be further coupled with another memory. In some examples, the wireless communication device 1200 further includes at least one external network interface that enables communication with a core network or backhaul network to gain access to external networks including the Internet.

The wireless communication device 1200 includes a first lifting component 1202, a second lifting component 1204, an LDPC encoding component 1206, an integer pair generation component 1208, an extension application component 1210, and a swapping lifting component 1212. Portions of one or more of the components 1202, 1204, 1206, 1208, 1210 and 1212 may be implemented at least in part in hardware or firmware. For example, the first lifting component 1202 or the second lifting component 1204 may be implemented at least in part by a modem. In some examples, at least some of the components 1202, 1204, 1206, 1208, 1210 and 1212 are implemented at least in part by a processor and as software stored in a memory. For example, portions of one or more of the components 1202, 1204, 1206, 1208, 1210 or 1212 can be implemented as non-transitory instructions (or "code") executable by the processor to perform the functions or operations of the respective module.

In some implementations, the processor may be a component of a processing system. A processing system may generally refer to a system or series of machines or components that receives inputs and processes the inputs to produce a set of outputs (which may be passed to other systems or components of, for example, the device 1200). For example, a processing system of the device 1200 may refer to a system including the various other components or subcomponents of the device 1200, such as the processor, or a transceiver, or a communications manager, or other components or combinations of components of the device 1200.

The processing system of the device 1200 may interface with other components of the device 1200, and may process information received from other components (such as inputs or signals) or output information to other components. For example, a chip or modem of the device 1200 may include a processing system, a first interface to output information and a second interface to obtain information. In some implementations, the first interface may refer to an interface between the processing system of the chip or modem and a transmitter, such that the device 1200 may transmit information output from the chip or modem. In some implementations, the second interface may refer to an interface between the processing system of the chip or modem and a receiver, such that the device 1200 may obtain information or signal inputs, and the information may be passed to the processing system. A person having ordinary skill in the art will readily recognize that the first interface also may obtain information or signal inputs, and the second interface also may output information or signal outputs.

The first lifting component 1202 is capable of, configured to, or operable to generate a first low-density parity check matrix and a first low-density parity check code by performing a first lifting on a base matrix.

The second lifting component 1204 is capable of, configured to, or operable to generate an extended low-density parity check matrix and an extended low-density parity check code by performing a second lifting on the first low-density parity check matrix, where one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code.

The LDPC encoding component 1206 is capable of, configured to, or operable to encode a first set of multiple bits according to the extended low-density parity check matrix and the extended low-density parity check code to produce an extended lifting. The LDPC encoding component 1206 may also be capable of, configured to, or operable to perform, at a first wireless device, a transmission of the lifted codeword to a second wireless device.

The integer pair generation component 1208 is capable of, configured to, or operable to generate an integer pair to identify one or more images of first low-density parity check lifted bit vectors within respective extended lifted low-density parity check bit vectors, a first integer of the integer pair corresponding to the first lifting step and a second integer of the integer pair corresponding to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within an extended low-density parity check lifted bit vector.

In some examples, the second lifting step includes the inner extension that retains first low-density parity check liftings as a sub-component of extended low-density parity check liftings based on the first lifting being recoverable from the second lifting via an application of a bit mask. In some examples, the second lifting step includes the outer extension that retains first low-density parity check liftings as a sub-component of extended low-density parity check liftings based on the first lifting being recoverable from the second lifting via an application of a modulo operation.

In some examples, the first lifting step is related to the second lifting step via a lifting factor and a modulo operation.

In some examples, the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

In some examples, the first lifting corresponding to the first integer of the integer pair is independent from the second lifting corresponding to the second integer of the integer pair in accordance with the inner extension, and the block-wise sub-matrices corresponding to a permutation of an image of the first lifting are identical.

The extension application component 1210 is capable of, configured to, or operable to perform the first lifting step and the second lifting step according to the inner extension or the outer extension, where the first lifting step and the second lifting step are performed according to the inner extension or the outer extension.

The swapping lifting component 1212 is capable of, configured to, or operable to swap at least two images of the one or more images of the first low-density parity check code during the first lifting step or the second lifting step.

Figure 13:
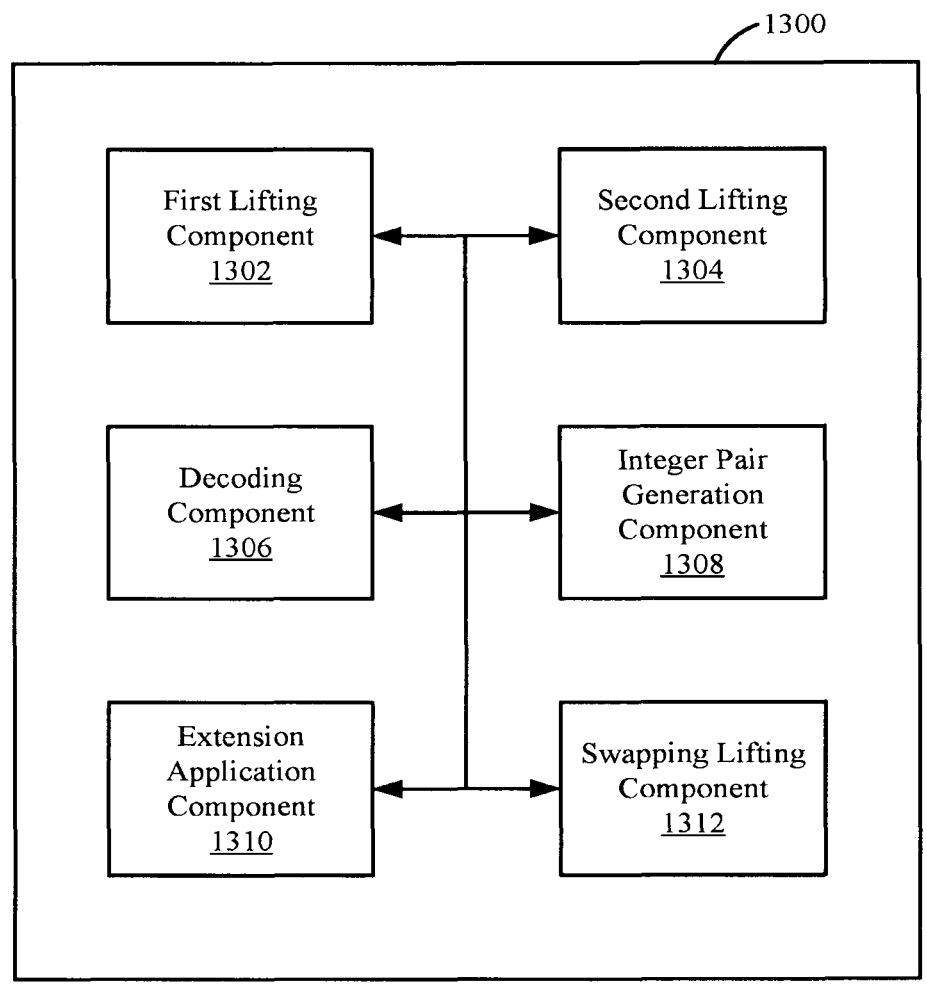
FIG. 13 shows a block diagram of an example wireless communication device that supports extending LDPC codes for Wi-Fi.

FIG. 13 shows a block diagram of an example wireless communication device 1300 that supports extending LDPC codes for Wi-Fi according to some aspects of the present disclosure. In some examples, the wireless communication device 1300 is configured or operable to perform the process 1100 described with reference to FIG. 11. In various examples, the wireless communication device 1300 can be a chip, SoC, chipset, package or device that may include: one or more modems (such as, a Wi-Fi (IEEE 802.11) modem or a cellular modem such as 3GPP 4G LTE or 5G compliant modem), one or more processors, processing blocks or processing elements (collectively "the processor"); one or more radios (collectively "the radio"); and one or more memories or memory blocks (collectively "the memory").

In some examples, the wireless communication device 1300 can be a device for use in a STA, such as STA 104 described with reference to FIG. 1. In some other examples, the wireless communication device 1300 can be a STA that includes such a chip, SoC, chipset, package or device as well as multiple antennas. The wireless communication device 1300 is capable of transmitting and receiving wireless communications in the form of, for example, wireless packets. For example, the wireless communication device can be configured or operable to transmit and receive packets in the form of physical layer PPDUs conforming to one or more of the IEEE 802.11 family of wireless communication protocol standards. In some examples, the wireless communication device 1300 also includes or can be coupled with an application processor which may be further coupled with another memory. In some examples, the wireless communication device 1300 further includes a user interface (UI) (such as a touchscreen or keypad) and a display, which may be integrated with the UI to form a touchscreen display. In some examples, the wireless communication device 1300 may further include one or more sensors such as, for example, one or more inertial sensors, accelerometers, temperature sensors, pressure sensors, or altitude sensors.

The wireless communication device 1300 includes a first lifting component 1302, a second lifting component 1304, a decoding component 1306, an integer pair generation component 1308, an extension application component 1310, and a swapping lifting component 1312. Portions of one or more of the components 1302, 1304, 1306, 1308, 1310 and 1312 may be implemented at least in part in hardware or firmware. For example, the first lifting component 1302 and the second lifting component 1304 may be implemented at least in part by a modem. In some examples, at least some of the components 1302, 1304, 1306, 1308, 1310 and 1312 are implemented at least in part by a processor and as software stored in a memory. For example, portions of one or more of the components 1302, 1304, 1306, 1308, 1310 or 1312 can be implemented as non-transitory instructions (or "code") executable by the processor to perform the functions or operations of the respective module.

In some implementations, the processor may be a component of a processing system. A processing system may generally refer to a system or series of machines or components that receives inputs and processes the inputs to produce a set of outputs (which may be passed to other systems or components of, for example, the device 1300). For example, a processing system of the device 1300 may refer to a system including the various other components or subcomponents of the device 1300, such as the processor, or a transceiver, or a communications manager, or other components or combinations of components of the device 1300. The processing system of the device 1300 may interface with other components of the device 1300, and may process information received from other components (such as inputs or signals) or output information to other components. For example, a chip or modem of the device 1300 may include a processing system, a first interface to output information and a second interface to obtain information. In some implementations, the first interface may refer to an interface between the processing system of the chip or modem and a transmitter, such that the device 1300 may transmit information output from the chip or modem. In some implementations, the second interface may refer to an interface between the processing system of the chip or modem and a receiver, such that the device 1300 may obtain information or signal inputs, and the information may be passed to the processing system. A person having ordinary skill in the art will readily recognize that the first interface also may obtain information or signal inputs, and the second interface also may output information or signal outputs.

The first lifting component 1302 is capable of, configured to, or operable to generate a first low-density parity check matrix and a first low-density parity check code by performing a first lifting on a base matrix.

The second lifting component 1304 is capable of, configured to, or operable to generating an extended low-density parity check matrix and an extended low-density parity check code by performing a second lifting on the first low-density parity check matrix, where one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code.

The decoding component 1306 is capable of, configured to, or operable to receive, from a first wireless device, a lifted codeword encoded based on the extended low-density parity check matrix. In some examples, the decoding component 1306 may be configured as or otherwise support a means for decoding the lifted codeword according to the extended low-density parity check code. In some examples, the second lifting includes a two-step lifting that includes a first lifting step and a second lifting step, and the decoding component 1306 may be configured as or otherwise support a means for decoding the lifted codeword in accordance with the first lifting step and the second lifting step in accordance with an inner extension or an outer extension.

The integer pair generation component 1308 is capable of, configured to, or operable to generate an integer pair to identify one or more images of first low-density parity check lifted bit vectors within respective extended lifted low-density parity check bit vectors, a first integer of the integer pair corresponding to the first lifting step and a second integer of the integer pair corresponding to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within an extended low-density parity check lifted bit vector.

In some examples, the decoding component 1306 may be configured as or otherwise support a means for decoding the lifted codeword in accordance with the inner extension, the inner extension retaining a first low-density parity check lifting permutation identifier as a sub-component of an extended low-density parity check lifting permutation identifier in accordance with the first low-density parity check lifting permutation identifier being recoverable from the extended low-density parity check lifting permutation identifier via an application of a bit mask. In some examples, the decoding component 1306 may be configured as or otherwise support means for decoding the lifted codeword in accordance with the outer extension, the outer extension retaining first low-density parity check lifting permutation identifiers as sub-components of extended low-density parity check lifting permutation identifiers in accordance with a first low-density parity check lifting permutation identifier being recoverable from an extended low-density parity check lifting permutation identifier via an application of a modulo operation.

In some examples, decoding component 1306 may be configured as or otherwise support a means for decoding the lifted codeword in accordance with the inner extension, the inner extension retaining a first low-density parity check lifting permutation identifier as a sub-component of an extended low-density parity check lifting permutation identifier in accordance with the first low-density parity check lifting permutation identifier being recoverable from the extended low-density parity check lifting permutation identifier via an application of a bit mask . . . .

In some examples, the second lifting step includes the outer extension that retains first low-density parity check liftings as a sub-component of extended low-density parity check liftings based on the first lifting being recoverable from the second lifting via an application of a modulo operation. In some examples, the decoding component 1306 may decode the lifted codeword in accordance with the outer extension, the outer extension retaining first low-density parity check lifting permutation identifiers as sub-components of extended low-density parity check lifting permutation identifiers in accordance with a first low-density parity check lifting permutation identifier being recoverable from an extended low-density parity check lifting permutation identifier via an application of a modulo operation In some examples, the first lifting step is related to the second lifting step via a lifting factor and a modulo operation.

In some examples, the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

In some examples, the first lifting corresponding to the first integer of the integer pair is independent from the second lifting corresponding to the second integer of the integer pair in accordance with the inner extension, and the block-wise sub-matrices corresponding to a permutation of an image of the first lifting are identical.

The extension application component 1310 is capable of, configured to, or operable to for perform the first lifting step and the second lifting step according to the inner extension or the outer extension.

In some examples, the extended low-density parity check code includes one or more lifted low-density parity check codes including at least the first low-density parity check code that is recoverable from the extended low-density parity check code.

The swapping lifting component 1312 is capable of, configured to, or operable to swap at least two images of the one or more images of the first low-density parity check code during the first lifting step or the second lifting step.

Implementation examples are described in the following numbered clauses:

Clause 1: A method for wireless communication, including: generating a first low-density parity check matrix and a first low-density parity check code by performing a first lifting on a base matrix; generating an extended low-density parity check matrix and an extended low-density parity check code by performing a second lifting on the first low-density parity check matrix, one or more lifted permutation matrices being associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code; encoding a first plurality of bits according to the extended low-density parity check matrix and the extended low-density parity check code to produce a lifted codeword; and performing, at a first wireless device, a transmission of the lifted codeword to a second wireless device.

Clause 2: The method of clause 1, where the extended low-density parity check matrix includes a two-step lifting that includes a first lifting step and a second lifting step, the second lifting step applied to a result of the first lifting step to produce an extended lifting, the method further including: generating an integer pair to identify one or more images of first low-density parity check lifted bit vectors within respective extended lifted parity check bit vectors, a first integer of the integer pair corresponding to the first lifting step and a second integer of the integer pair corresponding to the second lifting step, and bits of a first low-density parity check lifted bit vector of an extended first low-density parity check lifted bit vector are enumerated first according to the first integer of the integer pair identifying a bit within the first low-density parity check lifted bit vector and second according to the second integer of the integer pair identifying an image of the first low-density parity check lifted bit vector within an extended low-density parity check lifted parity check bit vector; and performing the first lifting step and the second lifting step in accordance with an inner extension or an outer extension of the first lifting to produce the extended low-density parity check code.

Clause 3: The method of clause 2, where the second lifting step includes the inner extension that retains first low-density parity check liftings as a sub-component of extended low-density parity check liftings in accordance with the first lifting being recoverable from the second lifting via an application of a bit mask.

Clause 4: The method of any of clauses 2 through 3, where the second lifting step includes the outer extension that retains first low-density parity check liftings as a sub-component of extended low-density parity check liftings in accordance with the first lifting being recoverable from the second lifting via an application of a modulo operation.

Clause 5: The method of any of clauses 2 through 4, where the first lifting step is related to the second lifting step via a lifting factor and a modulo operation.

Clause 6: The method of any of clauses 2 through 5, where the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

Clause 7: The method of any of clauses 2 through 6, where the first lifting corresponding to the first integer of the integer pair is independent from the second lifting corresponding to the second integer of the integer pair in accordance with the inner extension, and the block-wise sub-matrices corresponding to a permutation of an image of the first lifting are identical.

Clause 8: The method of any of clauses 2 through 7, further including: swapping at least two images of the one or more images of the first low-density parity check code during the first lifting step or the second lifting step.

Clause 9: The method of any of clauses 1 through 8, where the extended low-density parity check code includes one or more lifted low-density parity check codes including at least the first low-density parity check code that is recoverable from the extended low-density parity check code.

Clause 10: A method for wireless communication, including: generating a first low-density parity check matrix and a first low-density parity check code by performing a first lifting on a base matrix; generating an extended low-density parity check matrix and an extended low-density parity check code by performing a second lifting on the first low-density parity check matrix, one or more lifted permutation matrices associated with base edges of the first low-density parity check matrix are recoverable as block-wise sub-matrices of the one or more lifted permutation matrices associated with respective base edges of the extended low-density parity check matrix, the extended low-density parity check code being an extension of the first low-density parity check code; receiving, from a first wireless device, a lifted codeword encoded in accordance with the extended low-density parity check matrix; and decoding the lifted codeword according to the extended low-density parity check code.

Clause 11: The method of clause 10, where the extended low-density parity check matrix includes a two-step lifting that includes a first lifting step and a second lifting step, the second lifting step applied to a result of the first lifting step to produce an extended lifting, the method further including: generating an integer pair to identify one or more images of first low-density parity check lifted bit vectors within respective extended lifted low-density parity check bit vectors, a first integer of the integer pair corresponding to the first lifting step and a second integer of the integer pair corresponding to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within an extended low-density parity check lifted bit vector; and decoding the lifted codeword in accordance with the first lifting step and the second lifting step in accordance with an inner extension or an outer extension.

Clause 12: The method of clause 11, further including: decoding the lifted codeword in accordance with the inner extension, the inner extension retaining a first low-density parity check lifting permutation identifier as a sub-component of an extended low-density parity check lifting permutation identifier in accordance with the first low-density parity check lifting permutation identifier being recoverable from the extended low-density parity check lifting permutation identifier via an application of a bit mask.

Clause 13: The method of any of clauses 11 through 12, further including: decoding the lifted codeword in accordance with the outer extension, the outer extension retaining first low-density parity check lifting permutation identifiers as sub-components of extended low-density parity check lifting permutation identifiers in accordance with a first low-density parity check lifting permutation identifier being recoverable from an extended low-density parity check lifting permutation identifier via an application of a modulo operation.

Clause 14: The method of any of clauses 11 through 13, where the first lifting step is related to the second lifting step via a lifting factor and a modulo operation.

Clause 15: The method of any of clauses 11 through 14, where the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

Clause 16: The method of any of clauses 11 through 15, where the first lifting corresponding to the first integer of the integer pair is independent from the second lifting corresponding to the second integer of the integer pair in accordance with the inner extension, and the block-wise sub-matrices corresponding to a permutation of an image of the first lifting are identical.

Clause 17: The method of any of clauses 11 through 16, further including: swapping at least two images of the one or more images of the first low-density parity check code during the first lifting step or the second lifting step.

Clause 18: The method of any of clauses 11 through 17, where the extended low-density parity check code includes one or more lifted low-density parity check codes including at least the first low-density parity check code that is recoverable from the extended low-density parity check code.

Clause 19: An apparatus for wireless communication, including a processor; memory coupled with the processor; and instructions stored in the memory and executable by the processor to cause the apparatus to perform a method of any of clauses 1 through 9.

Clause 20: An apparatus for wireless communication, including at least one means for performing a method of any of clauses 1 through 9.

Clause 21: A non-transitory computer-readable medium storing code for wireless communication, the code including instructions executable by a processor to perform a method of any of clauses 1 through 9.

Clause 22: An apparatus for wireless communication, including a processor; memory coupled with the processor; and instructions stored in the memory and executable by the processor to cause the apparatus to perform a method of any of clauses 10 through 18.

Clause 23: An apparatus for wireless communication, including at least one means for performing a method of any of clauses 10 through 18.

Clause 24: A non-transitory computer-readable medium storing code for wireless communication, the code including instructions executable by a processor to perform a method of any of clauses 10 through 18.

As used herein, the term "determine" or "determining" encompasses a wide variety of actions and, therefore, "determining" can include calculating, computing, processing, deriving, investigating, looking up (such as via looking up in a table, a database or another data structure), inferring, ascertaining, measuring, and the like. Also, "determining" can include receiving (such as receiving information), accessing (such as accessing data stored in memory), transmitting (such as transmitting information) and the like. Also, "determining" can include resolving, selecting, obtaining, choosing, establishing and other such similar actions.

As used herein, a phrase referring to "at least one of" a list of items refers to any combination of those items, including single members. As an example, "at least one of: a, b, or c" is intended to cover: a, b, c, a-b, a-c, b-c, and a-b-c. As used herein, "or" is intended to be interpreted in the inclusive sense, unless otherwise explicitly indicated. For example, "a or b" may include a only, b only, or a combination of a and b.

As used herein, "based on" is intended to be interpreted in the inclusive sense, unless otherwise explicitly indicated. For example, "based on" may be used interchangeably with "based at least in part on," "associated with", or "in accordance with" unless otherwise explicitly indicated. Specifically, unless a phrase refers to "based on only 'a,'" or the equivalent in context, whatever it is that is "based on 'a,'" or "based at least in part on 'a,'" may be based on "a" alone or based on a combination of "a" and one or more other factors, conditions or information. In other words, as used herein, the phrase "based on" shall be construed in the same manner as the phrases "based at least in part on," "associated with", or "in accordance with" unless otherwise explicitly indicated. Specifically, unless a phrase refers to "based on only 'a,'" or the equivalent in context, whatever it is that is "based on 'a,'" or "based at least in part on 'a,'" may be based on "a" alone or based on a combination of "a" and one or more other factors, conditions or information.

As used herein, the term "determine" or "determining" encompasses a wide variety of actions and, therefore, "determining" can include calculating, computing, processing, deriving, investigating, looking up (such as via looking up in a table, a database or another data structure), inferring, ascertaining, measuring, and the like. Also, "determining" can include receiving (such as receiving information), accessing (such as accessing data stored in memory), transmitting (such as transmitting information) and the like. Also, "determining" can include resolving, selecting, obtaining, choosing, establishing and other such similar actions.

The various illustrative components, logic, logical blocks, modules, circuits, operations and algorithm processes described in connection with the examples disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the examples described in this disclosure may be readily apparent to persons having ordinary skill in the art, and the generic principles defined herein may be applied to other examples without departing from the spirit or scope of this disclosure. Thus, the claims are not intended to be limited to the examples shown herein, but are to be accorded the widest scope consistent with this disclosure, the principles and the novel features disclosed herein.

Additionally, various features that are described in this specification in the context of separate examples also can be implemented in combination in a single implementation. Conversely, various features that are described in the context of a single implementation also can be implemented in multiple examples separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

What is claimed is:

1. An apparatus for wireless communication at a first wireless device, comprising:
a processing system that includes processor circuitry and memory circuitry that stores code, the processing system configured to cause the first wireless device to:
generate a first low-density parity check matrix and a first low-density parity check code by performing a first lifting on a base matrix;
generate an extended low-density parity check matrix and an extended low-density parity check code by performing a second lifting on the first low-density parity check matrix, one or more lifted permutation matrices associated with base edges of the first low-density parity check matrix being recoverable as block-wise sub-matrices of the one or more lifted permutation matrices associated with respective base edges of the extended low-density parity check matrix, the extended low-density parity check code being an extension of the first low-density parity check code;
encode a first plurality of bits according to the extended low-density parity check matrix and the extended low-density parity check code to produce a lifted codeword; and
transmit, at the first wireless device, the lifted codeword to a second wireless device.

2. The apparatus of claim 1, wherein the extended low-density parity check matrix comprises a two-step lifting that includes a first lifting step and a second lifting step, the second lifting step applied to a result of the first lifting step to produce an extended lifting, and the processing system is further configured to cause the first wireless device to:
generate an integer pair to identify one or more images of first low-density parity check lifted bit vectors within respective extended lifted low-density parity check bit vectors, a first integer of the integer pair corresponding to the first lifting step and a second integer of the integer pair corresponding to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within the extended low-density parity check lifted bit vector; and
perform the first lifting step and the second lifting step in accordance with an inner extension or an outer extension of the first lifting to produce the extended low-density parity check code.

3. The apparatus of claim 2, wherein the second lifting step comprises the inner extension that retains first low-density parity check liftings as a sub-component of extended low-density parity check liftings in accordance with the first lifting being recoverable from the second lifting via an application of a bit mask.

4. The apparatus of claim 2, wherein the second lifting step comprises the outer extension that retains first low-density parity check liftings as a sub-component of extended low-density parity check liftings in accordance with the first lifting being recoverable from the second lifting via an application of a modulo operation.

5. The apparatus of claim 2, wherein the first lifting step is related to the second lifting step via a lifting factor and a modulo operation.

6. The apparatus of claim 2, wherein the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

7. The apparatus of claim 2, wherein the first lifting corresponding to the first integer of the integer pair is independent from the second lifting corresponding to the second integer of the integer pair in accordance with the inner extension, and the block-wise sub-matrices corresponding to a permutation of an image of the first lifting are identical.

8. The apparatus of claim 2, wherein the processing system is further configured to cause the first wireless device to:
swap at least two images of the one or more images of the first low-density parity check code during the first lifting step or the second lifting step.

9. The apparatus of claim 1, wherein the extended low-density parity check code comprises one or more lifted low-density parity check codes including at least the first low-density parity check code that is recoverable from the extended low-density parity check code.

10. A method for wireless communication at a first wireless device, comprising:
generating a first low-density parity check matrix and a first low-density parity check code by performing a first lifting on a base matrix;
generating an extended low-density parity check matrix and an extended low-density parity check code by performing a second lifting on the first low-density parity check matrix, one or more lifted permutation matrices associated with base edges of the first low-density parity check matrix being recoverable as block-wise sub-matrices of the one or more lifted permutation matrices associated with respective base edges of the extended low-density parity check matrix, the extended low-density parity check code being an extension of the first low-density parity check code;
encoding a first plurality of bits according to the extended low-density parity check matrix and the extended low-density parity check code to produce a lifted codeword; and
transmitting, at the first wireless device, the lifted codeword to a second wireless device.

11. The method of claim 10, wherein the extended low-density parity check matrix comprises a two-step lifting that includes a first lifting step and a second lifting step, the second lifting step applied to a result of the first lifting step to produce an extended lifting, the method further comprising:
generating an integer pair to identify one or more images of first low-density parity check lifted bit vectors within respective extended lifted parity check bit vectors, a first integer of the integer pair corresponding to the first lifting step and a second integer of the integer pair corresponding to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within the extended low-density parity check lifted bit vector; and performing the first lifting step and the second lifting step in accordance with an inner extension or an outer extension of the first lifting to produce the extended low-density parity check code.

12. The method of claim 11, wherein the second lifting step comprises the inner extension that retains first low-density parity check liftings as a sub-component of extended low-density parity check liftings in accordance with the first lifting being recoverable from the second lifting via an application of a bit mask.

13. The method of claim 11, wherein the second lifting step comprises the outer extension that retains first low-density parity check liftings as a sub-component of extended low-density parity check liftings in accordance with the first lifting being recoverable from the second lifting via an application of a modulo operation.

14. The method of claim 11, wherein the first lifting step is related to the second lifting step via a lifting factor and a modulo operation.

15. The method of claim 11, wherein the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

16. The method of claim 11, wherein the first lifting corresponding to the first integer of the integer pair is independent from the second lifting corresponding to the second integer of the integer pair in accordance with the inner extension, and the block-wise sub-matrices corresponding to a permutation of an image of the first lifting are identical.

17. The method of claim 11, further comprising:
swapping at least two images of the one or more images of the first low-density parity check code during the first lifting step or the second lifting step.

18. The method of claim 10, wherein the extended low-density parity check code comprises one or more lifted low-density parity check codes including at least the first low-density parity check code that is recoverable from the extended low-density parity check code.

19. An apparatus for wireless communication at a first wireless device, comprising:
a processing system that includes processor circuitry and memory circuitry that stores code, the processing system configured to cause the first wireless device to:
generate a first low-density parity check matrix and a first low-density parity check code by performing a first lifting on a base matrix;
generate an extended low-density parity check matrix and an extended low-density parity check code by performing a second lifting on the first low-density parity check matrix, one or more lifted permutation matrices associated with base edges of the first low-density parity check matrix being recoverable as block-wise sub-matrices of the one or more lifted permutation matrices associated with respective base edges of the extended low-density parity check matrix, the extended low-density parity check code being an extension of the first low-density parity check code;

receive, from a second wireless device, a lifted codeword encoded in accordance with the extended low-density parity check matrix; and
decode the lifted codeword according to the extended low-density parity check code.

20. The apparatus of claim 19, wherein the extended low-density parity check matrix comprises a two-step lifting that includes a first lifting step and a second lifting step, the second lifting step applied to a result of the first lifting step to produce an extended lifting, and the processing system is further configured to cause the first wireless device to:
generate an integer pair to identify one or more images of first low-density parity check lifted bit vectors within respective extended lifted low-density parity check bit vectors, a first integer of the integer pair corresponding to the first lifting step and a second integer of the integer pair corresponding to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within the extended low-density parity check lifted bit vector; and
decode the lifted codeword in accordance with the first lifting step and the second lifting step in accordance with an inner extension or an outer extension.

21. The apparatus of claim 20, wherein the processing system is further configured to cause the first wireless device to:
decode the lifted codeword in accordance with the inner extension, the inner extension retaining a first low-density parity check lifting permutation identifier as a sub-component of an extended low-density parity check lifting permutation identifier in accordance with the first low-density parity check lifting permutation identifier being recoverable from the extended low-density parity check lifting permutation identifier via an application of a bit mask.

22. The apparatus of claim 20, wherein the processing system is further configured to cause the first wireless device to:
decode the lifted codeword in accordance with the outer extension, the outer extension retaining first low-density parity check lifting permutation identifiers as sub-components of extended low-density parity check lifting permutation identifiers in accordance with a first low-density parity check lifting permutation identifier being recoverable from an extended low-density parity check lifting permutation identifier via an application of a modulo operation.

23. The apparatus of claim 20, wherein the first lifting step is related to the second lifting step via a lifting factor and a modulo operation.

24. The apparatus of claim 20, wherein the inner extension retains lifted edge permutations of the first low-density parity check code as a sub-component of edge permutations of the extended low-density parity check code in accordance with a first lifting permutation being recoverable from an extended lifting permutation as a block-wise sub-matrix of the extended low-density parity check matrix.

25. The apparatus of claim 20, wherein the first lifting corresponding to the first integer of the integer pair is independent from the second lifting corresponding to the second integer of the integer pair in accordance with the inner extension, and the block-wise sub-matrices corresponding to a permutation of an image of the first lifting are identical.

26. The apparatus of claim 20, wherein the processing system is further configured to cause the first wireless device to:
    swap at least two images of the one or more images of the first low-density parity check code during the first lifting step or the second lifting step.

27. The apparatus of claim 20, wherein the extended low-density parity check code comprises one or more lifted low-density parity check codes including at least the first low-density parity check code that is recoverable from the extended low-density parity check code.

28. A method for wireless communication at a first wireless device, comprising:
    generating a first low-density parity check matrix and a first low-density parity check code by performing a first lifting on a base matrix;
    generating an extended low-density parity check matrix and an extended low-density parity check code by performing a second lifting on the first low-density parity check matrix, one or more lifted permutation matrices associated with base edges of the first low-density parity check matrix being recoverable as block-wise sub-matrices of the one or more lifted permutation matrices associated with respective base edges of the extended low-density parity check matrix, the extended low-density parity check code being an extension of the first low-density parity check code;
    receiving, from a second wireless device, a lifted codeword encoded via the extended low-density parity check matrix; and
    decoding the lifted codeword according to the extended low-density parity check code.

29. The method of claim 28, wherein the extended low-density parity check matrix comprises a two-step lifting that includes a first lifting step and a second lifting step, the second lifting step applied to a result of the first lifting step to produce an extended lifting, the method further comprising:
    generating an integer pair to identify one or more images of first low-density parity check lifted bit vectors within respective extended lifted low-density parity check bit vectors, a first integer of the integer pair corresponding to the first lifting step and a second integer of the integer pair corresponding to the second lifting step, and bits of a first low-density parity check lifted bit vector of an extended low-density parity check lifted bit vector are enumerated first according to the first integer of the integer pair identifying a bit within the first low-density parity check lifted bit vector and second according to the second integer of the integer pair identifying an image of the first low-density parity check lifted bit vector within the extended low-density parity check lifted bit vector; and
    decoding the lifted codeword in accordance with the first lifting step and the second lifting step in accordance with an inner extension or an outer extension.

30. The method of claim 29, further comprising:
    decoding the lifted codeword in accordance with the inner extension, the inner extension retaining a first low-density parity check lifting permutation identifier as a sub-component of an extended low-density parity check lifting permutation identifier in accordance with the first low-density parity check lifting permutation identifier being recoverable from the extended low-density parity check lifting permutation identifier via an application of a bit mask.

* * * * *